United States Patent
Declercq et al.

(10) Patent No.: US 11,258,460 B2
(45) Date of Patent: Feb. 22, 2022

(54) METHOD AND APPARATUS FOR VERTICAL LAYERED DECODING OF QUASI-CYCLIC LOW-DENSITY PARITY CHECK CODES BUILT FROM CLUSTERS OF CIRCULANT PERMUTATION MATRICES

(71) Applicant: Codelucida, Inc., Tucson, AZ (US)

(72) Inventors: David Declercq, Tucson, AZ (US); Benedict J. Reynwar, Tucson, AZ (US); Vamsi Krishna Yella, Tucson, AZ (US)

(73) Assignee: Codelucida, Inc., Tucson, AZ (US)

( * ) Notice: Subject to any disclaimer, the term of this patent is extended or adjusted under 35 U.S.C. 154(b) by 0 days.

(21) Appl. No.: 17/344,689

(22) Filed: Jun. 10, 2021

(65) Prior Publication Data

US 2021/0391872 A1    Dec. 16, 2021

Related U.S. Application Data

(60) Provisional application No. 63/037,393, filed on Jun. 10, 2020.

(51) Int. Cl.
H03M 13/00 (2006.01)
H03M 13/11 (2006.01)

(52) U.S. Cl.
CPC ...... H03M 13/1108 (2013.01); H03M 13/116 (2013.01)

(58) Field of Classification Search
CPC .......... H03M 13/116; H03M 13/1165; H03M 13/1108; H03M 13/1105; H03M 13/616
See application file for complete search history.

(56) References Cited

U.S. PATENT DOCUMENTS 7,519,895 B2    4/2009   Kyung
8,161,345 B2 *  4/2012   Graef ................. H03M 13/116
                                                           714/752

(Continued)

FOREIGN PATENT DOCUMENTS

EP    2273683    1/2011
EP    2833553    2/2015

OTHER PUBLICATIONS

Angarita et al. "Reduced-complexity min-sum algorithm for decoding IDPC codes with low error-floor," IEEE Transactions on Circuits and Systems—I: Regular Papers, IEEE, Jul. 1, 2014, 61(7):2150-2158.

(Continued)

*Primary Examiner* — Esaw T Abraham
(74) *Attorney, Agent, or Firm* — Fish & Richardson P.C.

(57) ABSTRACT

This invention presents a method and the corresponding hardware apparatus for decoding LDPC codes using a vertical layered (VL) iterative message passing algorithm. The invention operates on quasi-cyclic LDPC (QC-LDPC) codes, for which the non-zero circulant permutation matrices (CPMs) are placed at specific locations in the parity-check matrix of the codes, forming concentrated clusters of CPMs. The purpose of the invention is to take advantage of the organization of CPMs in clusters in order to derive a specific hardware architecture, consuming less power than the classical VL decoders. This is achieved by minimizing the number of read and write accesses to the main memories of the design.

19 Claims, 13 Drawing Sheets

(56) References Cited

U.S. PATENT DOCUMENTS

| | | | |
|---|---|---|---|
| 8,458,556 | B2 | 6/2013 | Planjery et al. |
| 8,510,624 | B2 | 8/2013 | Kim et al. |
| 8,918,694 | B2* | 12/2014 | Morero ............ H03M 13/1137 714/752 |
| 9,015,550 | B2* | 4/2015 | Wang ............... H03M 13/6343 714/755 |
| 9,048,867 | B2* | 6/2015 | Liu .................... H03M 13/1117 |
| 9,331,716 | B2 | 5/2016 | Panteleev et al. |
| 9,459,956 | B2* | 10/2016 | Hubris ................ H03M 13/116 |
| 9,553,608 | B2* | 1/2017 | Li ....................... G06F 11/1068 |
| 10,110,249 | B2 | 10/2018 | Zhang et al. |
| 10,367,526 | B2* | 7/2019 | Liu .................... H03M 13/1111 |
| 10,530,392 | B2 | 1/2020 | Reynwar et al. |
| 10,594,339 | B2* | 3/2020 | Panteleev ......... H03M 13/1102 |
| 10,651,872 | B2* | 5/2020 | Savin ................ H03M 13/1128 |
| 10,778,251 | B2 | 9/2020 | Declercq et al. |
| 2003/0126551 | A1 | 7/2003 | Mantha et al. |
| 2005/0149842 | A1 | 6/2005 | Kyung et al. |
| 2005/0229090 | A1 | 10/2005 | Shen et al. |
| 2006/0036926 | A1 | 2/2006 | Hocevar |
| 2007/0283219 | A1 | 12/2007 | Park et al. |
| 2014/0223254 | A1 | 8/2014 | Pisek |
| 2014/0229792 | A1 | 8/2014 | Varnica et al. |
| 2017/0141796 | A1 | 5/2017 | Koike-Akino et al. |
| 2017/0244515 | A1 | 8/2017 | Razzetti et al. |
| 2018/0062666 | A1 | 3/2018 | Zhang et al. |
| 2019/0044537 | A1 | 2/2019 | Reynwar et al. |
| 2020/0044667 | A1 | 2/2020 | Declercq et al. |
| 2020/0220557 | A1 | 7/2020 | Reynwar et al. |

OTHER PUBLICATIONS

Cai et al., "Low-Complexity Finite Alphabet Iterative Decoders for LDPC Codes," IEEE International Symposium on Circuits and Systems, May 2013, 1332-1335.

Cai, Fang et al., "Finite Alphabet Iterative Decoders for LDPC Codes: Optimization, Architecture and Analysis", IEEE Transactions On Circuits And Systems I: Regular Papers, IEEE, US, vol. 61, No. 5, May 1, 2014 (May 1, 2014), pp. 1366-1375, XP011546491, ISSN: 1549-8328, DOI: 10.1109/TCSI.2014.2309896 [retrieved on Apr. 24, 2014].

Catala-Perez et al. "Second minimum approximation for min-sum decoders suitable for high-rate IDPC codes," Circuits, Systems and Signal Processing, Apr. 5, 2019, 38(11):5068-5080.

Cui et al., "Reduced-complexity column-layered decoding and implementation for LDPC codes," IET Commun, 2011, 5(15): 2177-2186.

Declercq et al. "An Imprecise Stopping Criterion Based on In-Between Layers Partial Syndromes," IEEE Communications Letters, Jan. 2018, 22(1): 13-16.

Declercq et al., "Approaching Maximum Likelihood decoding of finite length LDPC codes via FAID diversity," IEEE Information Theoiy Workshop, 2012, 487-491.

Declercq et al., "Finite Alphabet Iterative Decoders—Part II: Towards Guaranteed Error Correction of LDPC Codes via Iterative Decoder Diversity," IEEE Transactions on Communications, Oct. 2013, 61(10): 4046-4057.

Extended European Search Report in European Appln. No. 21167522. 8, dated Aug. 9, 2021, 15 pages.

Extended European Search Report, dated Jul. 6, 2020, corresponding to European Application No. EP 18841488.2, 19 pages.

Hocevar, "A Reduced Complexity Decoder Architecture via Layered Decoding of LDPC Codes," IEEE SIPS, 2004, 107-112.

International Search Report and Written Opinion of the International Searching Authority, PCT Application No. PCT/US19/45001, dated Oct. 29, 2019, 10 pages.

International Search Report and Written Opinion of the International Searching Authority, PCT Application No. PCT/US2018/044691, dated Oct. 30, 2018, 12 pp.

Kanchetla, Vijaya Kumar et al.: "Multi-standard high-throughput and low-power quasi-cyclic low density parity check decoder for worldwide interoperability for microwave access and wireless fidelity standards", IET Circuits Devices And Systems, The Institution Of Engineering And Technology, GB, vol. 10, No. 2, Mar. 1, 2016 (Mar. 1, 2016), pp. 111-120, XP006076546, ISSN: 1751-858X, DOI: 10.1049/IET-CDS.2014.0347.

Li, Rongchun et al.: "A multi-standard efficient column-layered LDPC decoder for Software Defined Radio on GPUs", PROC., IEEE 14th Workshop On Signal Processing Advances In Wireless Communications, SPAWC, Jun. 16, 2013 (Jun. 16, 2013), pp. 724-728, XP032490422, ISSN: 1948-3244, DOI: 10.1109/SPAWC. 2013.6612145 [retrieved on Sep. 25, 2013].

Nguyen-Ly et al., "Analysis and Design of Cost-Effective High-Throughput LDPC Decoders," IEEE Transactions on Very Large Scale Integration (VLSI) Systems, Mar. 2018, 26(3): 508-521.

Planjery et al., "Finite alphabet iterative decoders—Part I: Decoding Beyond Belief Propagation on the Binary Symmetric Channel," IEEE Transactions on Communications, Oct. 2013, 61(10): 4033-4045.

Planjery et al., "Finite alphabet iterative decoders LDPC codes surpassing floating-point iterative decoders," Electronic Letters, Aug. 2011, 47(16): 2 pages.

Radosavljevic et al., "Optimized Message Passing Schedules for LDPC Decoding," IEEE Signals, Systems and Computers, Oct. 2005, 591-595.

Sharon et al., "Efficient Serial Message-Passing Schedules for LDPC decoding," IEEE Transactions on Information Theory, Nov. 2007, 53(11): 4076-4091.

Vasic and Milenkovic, "Combinatorial Constructions of Low-Density Parity-Check Codes for Iterative Decoding," IEEE Transactions on Information Theory, Jun. 2004, 50(6): 1156-1176.

Zhang and Fossorier, "Transactions Letters: Shuffled Iterative Decoding," IEEE Transactions on Communications, Feb. 2005, 53(2): 209-213.

Zhang et al., "Efficient column-layered decoders for single block-row quasi-cyclic LDPC codes," IEEE International Symposium on Circuits and Systems, Jun. 1, 2014, 413-416.

Wang et al.: "VLSI Design for Low-Density Parity-Check Code Decoding", IEEE Circuits And Systems Magazine, IEEE Service Center, New York, NY, US, vol. 11, No. 1, Jan. 1, 2011 (Jan. 1, 2011), pp. 52-69, XP011348868, ISSN: 1531-636X, DOI: 10.1109/MCAS.2010.939785.

* cited by examiner (a) 2-clusters (b) K-clusters

METHOD AND APPARATUS FOR VERTICAL LAYERED DECODING OF QUASI-CYCLIC LOW-DENSITY PARITY CHECK CODES BUILT FROM CLUSTERS OF CIRCULANT PERMUTATION MATRICES

CROSS-REFERENCE TO RELATED APPLICATION

This application claims priority to U.S. Provisional Patent Application No. 63/037,393, filed Jun. 10, 2020, the entire contents of which are incorporated herein by reference.

FIELD OF INVENTION

This invention generally relates to error correction coding for information transmission, storage and processing systems, such as wired and wireless communications systems, optical communications systems, computer memories, mass data storage systems, etc. More particularly, it relates to the simplification and the optimization of low complexity and low power architectures for the hardware implementation of vertical layered iterative low-density parity check (LDPC) decoders. The invention is specifically designed for quasi-cyclic LDPC (QC-LDPC) codes build from clusters of circulant permutation matrices (CPMs), with the main objective of reducing the power consumption of the memory accesses during the decoding process.

BACKGROUND OF THE INVENTION

Error correcting codes play a vital role in communication, computer, and storage systems by ensuring the integrity of data. The past decades have witnessed a surge in research in coding theory which resulted in the development of efficient coding schemes based on LDPC codes. Iterative message passing decoding algorithms together with suitably designed LDPC codes have been shown to approach the information-theoretic channel capacity in the limit of infinite codeword length. LDPC codes are standardized in a number of applications such as wireless networks, satellite communications, deep-space communications, and power line communications.

For an (N, K) LDPC code with length N and dimension K, the parity-check matrix (PCM) H of size M×N=(N−K)×N (assuming that H is full rank) is composed of a small number of non-zero entries, i.e. a small number of ones. We denote the degree of the n-th column, i.e. the number of ones in the n-th column, by $d_v(n)$, $1 \le n \le N$. Similarly, we denote the degree of the m-th row, i.e. the number of ones in the m-th row, by $d_c(m)$, $1 \le m \le M$. Further, we define the maximum degree for the rows and columns:

$$d_{v,max} = \max_{1 \le n \le N} d_v(n) \quad d_{c,max} = \max_{1 \le n \le N} d_c(m) \qquad (1)$$

When the number of ones in the columns and the rows of H is constant, the LDPC code is said to be regular, otherwise the LDPC code is said to be irregular. For regular LDPC codes, we have $d_{v,max}=d_v=d_v(n)$, $1 \le n \le N$, and $d_{c,max}=d_c=d_c(m)$, $1 \le m \le M$. The $(d_v, d_c)$-regular LDPC codes represent a special interesting type of LDPC codes. For this type, the code rate is $R=K/N=1-d_v/d_c$ if the PCM H is full rank. Except when it is necessary for the clarity of the argumentation, we will drop the indices n or m in the notations for the degrees of the rows and columns. It is clear however, that all embodiments of the present invention apply both for regular and irregular LDPC codes.

If a binary column vector of length N, denoted $x=[x_1, x_2, \ldots, x_N]^T$ is a codeword, then it satisfies Hx=0, where the operations of multiplication and addition are performed in the binary field GF(2), and 0 is the length-M all-zero column vector. $x^T$ denotes the transposition of x, both for vectors and matrices. An element in a matrix can be denoted indifferently by $H_{m,n}$ or H(m, n). Similarly, an element in a vector is denoted by $x_n$ or x(n). The horizontal concatenation and vertical concatenation, of vectors and matrices are denoted [A, B] and [A; B], respectively.

The present invention relates to the class of QC-LDPC. In QC-LDPC codes, the PCM H is composed of square blocks or sub-matrices of size L×L, as described in equation (2), in which each block $H_{i,j}$ is either (i) a all-zero L×L block, or (ii) a circulant permutation matrix (CPM).

$$H = \begin{bmatrix} H_{1,1} & H_{1,2} & \cdots & H_{1,N_b} \\ H_{2,1} & H_{2,2} & \cdots & H_{2,N_b} \\ \vdots & \vdots & \vdots & \vdots \\ H_{M_b,1} & H_{M_b,2} & \cdots & H_{M_b,N_b} \end{bmatrix} \qquad (2)$$

A CPM is defined as the power of a primitive element of a cyclic group. The primitive element is defined, for example, by the L×L matrix $\alpha$ shown in equation (3) for the case of L=8. As a result, a CPM $\alpha^k$ with $k \in \{0, \ldots, L-1\}$ has the form of the identity matrix, shifted k positions to the left. Said otherwise, the row-index of the nonzero value of the first column of $\alpha^k$ is k+1. The value of k is referred to as the CPM value. The main feature of a CPM is that it has only a single nonzero element in each row/column and can be defined by its first row/column together with a process to generate the remaining rows/columns. The simplicity of this process translates to low complexity needed for realizing physical connections between subsets of codeword bits and subsets of parity-check equations in an QC-LDPC encoder or decoder.

$$\alpha = \begin{bmatrix} 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{bmatrix} \qquad (3)$$

The PCM of a QC-LDPC code can be conveniently represented by a base matrix (or protograph matrix) B, with $M_b$ rows and $N_b$ columns, which contains integer values, indicating the powers of the primitive element for each block $H_{i,j}$. Consequently, the dimensions of the base matrix are related to the dimensions of the PCM the following way: $M=M_b$ L, $N=N_b$ L, and $K=K_b$ L (assuming that H is full rank). An example of matrices H and B for $M_b \times N_b = 4 \times 5$ and L=8 is shown in equation (4).

$$H = \begin{bmatrix} \alpha^7 & \alpha^1 & \alpha^4 & \alpha^3 & 0 \\ \alpha^2 & 0 & \alpha^3 & I & \alpha^4 \\ \alpha^4 & \alpha^6 & 0 & I & \alpha^2 \\ I & \alpha^2 & \alpha^7 & 0 & \alpha^5 \end{bmatrix} \quad B = \begin{bmatrix} 7 & 1 & 4 & 3 & -\infty \\ 2 & -\infty & 3 & 0 & 4 \\ 4 & 6 & -\infty & 0 & 2 \\ 0 & 2 & 7 & -\infty & 5 \end{bmatrix} \quad (4)$$

where $I = \alpha^0$ is the identity matrix, and by convention $\alpha^{-\infty} = 0$ is the all-zero L×L matrix. In this invention, the rows of the base matrix will be denoted block-rows of the PCM, while the columns of the base matrix will be denoted block-columns.

For QC-LDPC codes, a block-row of the parity-check matrix H, composed of L consecutive rows of the PCM, is referred to as a horizontal layer, or row-layer. For example, the i-th block-row in equation (2) defines the i-th row-layer. Similarly, a vertical layer, or column-layer, is composed of L consecutive columns of the PCM. For example, the j-th block-column in equation (2) defines the j-th column-layer.

The concept of layer can be further extended to the concept of generalized layer (GL). The definition follows:

A generalized layer is defined as the concatenation of two or more layers of H, such that in each block-column of the submatrix defined by the generalized layer, there is at most one non-zero CPM while the other blocks are all-zero blocks.

A full generalized layer has further the property that each block-column of the submatrix defined by the generalized layer contains exactly one non-zero CPM.

This definition allows that, for a QC-LDPC code with maximum column degree $d_{v,max}$, the PCM could be designed with at least $d_{v,max}$ generalized layers. For simplicity of the presentation, and without loss of generality, we will assume that the number of GLs is always equal to the maximum column degree $d_{v,max}$.

FIG. 1 shows an example of a PCM organized in $d_v = 4$ full GLs, indicated by 101, 102, 103 and 104. In this example, each of the GL contains 4 block-rows, for a total of $M_b = 16$ block-rows. In general, each GL may contain a different number of block-rows, as long as the GL constraint in above definition is satisfied. In this example, the first GL 101 indicated in grey is composed of the first four block-rows of the base matrix. The purpose of the GL organization of the PCM is to be able to perform processing of several CPMs in parallel, without data access conflicts.

The parity-check matrix H can be conveniently represented by a bipartite Tanner graph C, consisting of a set of variable nodes (VN) $V = \{v_1, v_2, \ldots, v_N\}$ of cardinality N, and a set of check nodes (CN) $C = \{c_1, c_2, \ldots, c_M\}$ of cardinality M. The variable nodes represent the codeword bits and the check nodes represent the parity-check equations, of the LDPC code. Variable nodes and check nodes are connected by edges where an edge exists between nodes $c_m$ and $v_n$ if the matrix element in the parity-check matrix is equal to $H_{m,n} = 1$. The degree of check node $c_m$, denoted $d_c(m)$, is the number of variable nodes it is connected to, and the degree of variable node $v_n$, denoted $d_v(n)$ is the number of check nodes it is connected to. An LDPC code is said to be regular if its Tanner Graph has a constant variable node degree $d_v(n) = d_v$, $\forall n$, and a constant check node degree $d_c(m) = d_c$, $\forall m$. The LDPC code is said to be irregular otherwise. Let us further denote by $\mathcal{N}(c_m)$ the set of variable nodes connected to $c_m$, and by $\mathcal{N}(v_n)$ the set of check nodes connected to $v_n$.

An iterative decoder operating on a Tanner graph of an LDPC code exchanges messages between the VNs and the CNs, along the edges connecting the two kind of nodes. An edge supports messages in the two directions: variable-to-check messages, denoted $\mu_{v,c}$ and check-to-variable messages, denoted $\mu_{c,v}$.

Also relevant to this invention is the concept of layered decoding that is used to improve the decoder convergence speed while still maintaining a low hardware complexity. Layered LDPC decoding schemes effectively improve the convergence by reducing the required number of decoding iterations needed to reach successful decoding. A layered decoder produces messages from a subset of the check nodes to a subset of the variable nodes, and then produces messages from a subset of the variable nodes to a subset of the check nodes.

An iterative decoder is usually defined by the VN update (VNU) processing, the CN update (CNU) processing, and the scheduling of the message computation. The scheduling defines the order in which the VNU and the CNU operations are performed in the entire Tanner graph of the LDPC code. There are three main types of scheduling for iterative message-passing LDPC decoders: (i) the flooding schedule, (ii) the horizontal layered (HL) scheduling, (iii) the vertical layered (VL) scheduling. The HL and VL schedules are typically used in conjunction with QC-LDPC codes. In HL decoding the message updating is performed row-layer by row-layer, while in VL decoding the message computation is performed column-layer by column-layer.

This invention concerns an iterative LDPC decoder following the VL scheduling. We will refer only to this particular scheduling throughout the description.

The present invention applies to any binary input symmetric channel, and can be generalized easily to channels with non-binary inputs. Let x be a codeword of a length N QC-LDPC code. The codeword is sent over a noisy memoryless channel with outputs y, which values belong to a q-ary alphabet $\mathcal{Y}$. The channel precision $n_q$ is the number of bits required to represent the q-ary alphabet, i.e. $2^{n_q} \geq q$. The inputs of the decoder, denoted channel values, can be defined by the quantized measurements of the noisy channel, i.e. the values of y, or by any transformation of these measurements. For example, and without loss of generality, the channel values can be defined as log-likelihood ratios (LLRs), computed from the conditional channel probabilities, equal to $LLR(y) = \text{prob}(y|x=0)/\text{prob}(y|x=1)$.

The embodiments of the present invention are further related to a class of iterative message-passing decoders called finite alphabet iterative decoders (FAIDs). In these decoders, the messages $\mu_{c,v}$ and $\mu_{v,c}$ belong to a finite alphabet $\mathcal{M}$ which consists of a finite—typically small—number of levels, denoted s. The s levels can be represented using $n_s$ bits of precision, such that $2^{n_s} \geq s$. For the specific illustrative case where $\mathcal{M}$ has odd cardinality, the message alphabet is denoted $$\mathcal{M} = \left\{ 0, \pm a_k : 1 \leq k \leq \frac{s-1}{2} \right\}$$

where $a_k \geq a_l$ for any $k > l$. Note that the the message alphabet and the channel alphabet can have different cardinalities, $s \neq q$.

The VNU for a variable node v of degree $d_v$ in a FAID is implemented using a pre-defined function $\Phi_v : \mathcal{Y} \times \{\mathcal{M}\}^{d_v-1} \to \mathcal{M}$ which in this description is referred to as VNU function. It computes the outgoing message on a particular edge as a function of a channel value y and $d_v - 1$ incoming messages at the node, excluding the incoming message on that particular edge. For example, to compute the output message $$\mu_{v,c_{d_v}},$$

we use:

$$\mu_{v,c_{d_v}} = \Phi_v(y, \mu_{c_1,v}, \ldots, \mu_{c_{d_v-1},v})\mu_{c_1,v} \in \mathcal{M} \ldots \mu_{c_{d_v-1},v} \in \mathcal{M} \quad (5)$$

The VNU function can be optimized to improve the error-correction capability of the decoder. The VNU function for the channel value y=+Y can be deduced from the one with channel value y=−Y by symmetry:

$$\Phi_v(Y, \mu_{c_1,v}, \ldots, \mu_{c_{d_v-1},v}) = -\Phi_v(-Y, -\mu_{c_1,v}, \ldots, -\mu_{c_{d_v-1},v}) \quad (6)$$

The CNU function $\Phi_c$ used in FAID is similar to the function used in the min-sum decoder which is typically used in the state-of-the-art. If $$\mu_{v_1,c}, \ldots, \mu_{v_{d_c-1},c}$$

represent the incoming messages to a node c with degree $d_c$ then $\Phi_c$ is given by $$\mu_{c,v_{d_c}} = \Phi_C(\mu_{v_1,c}, \ldots, \mu_{v_{d_c-1},c}) = \left(\prod_{k=1}^{d_c-1} \text{sign}(\mu_{v_k,c})\right) \min_{1 \le k \le d_c-1}(|\mu_{v_k,c}|). \quad (7)$$

Depending on the scheduling type that is used, the CNU can be implemented in various ways. The specifics about the CNU implementation for VL decoding will be presented subsequently.

Finally, in order to compute a hard-decision estimate of the codeword bit for the VN v, an a posteriori probability (APP) is computed using:

$$APP(v) = \Phi_{APP}(y, \mu_{c_1,v}, \ldots, \mu_{c_{d_v}}, v)\mu_{c_1,v} \in \mathcal{M} \ldots \mu_{c_{d_v}} v \in \mathcal{M} \quad (8)$$

The hard-decision estimate of the n-th codeword bit, denoted $\hat{x}_n$ is equal to:

$$\begin{cases} \hat{x}_n = 0 \text{ if } APP(v_n) > 0 \\ \hat{x}_n = 1 \text{ if } APP(v_n) < 0 \\ \hat{x}_n = \frac{1 - \text{sign}(y_n)}{2} \text{ if } APP(v_n) > 0 \end{cases} \quad (9)$$

If the hard decision estimates have a syndrome equal to zero, i.e., $$H\hat{X} = s = 0 \quad (10)$$

then the decoder has successfully converged to a valid codeword.

Let us now describe the general principle of VL decoding of QC-LDPC codes, with a focus on the memory organization and the CNU processing. For each CN $c_m$ connected to $d_c$ VNs, there are $d_c$ incoming variable-to-check messages to the CNU, denoted $\mu_{v_c,c_m}$, $\forall v_n \in \mathcal{N}(c_m)$. The messages can be written in sign-magnitude representation $\mu_{v_c,c_m} = \text{sign}_{m,n} \text{mag}_{m,n}$, where $\text{sign}_{m,n}$ is the sign of the message and $\text{mag}_{m,n}$ its magnitude. We further define $\text{index}_{m,n}$ as the index of the block-column containing the n-th VN connected to check node $c_m$. Alternatively, $\text{index}_{m,n}$ can represent the index of the edge, among the $d_c$ edges connected to cm, supporting the message with magnitude $\text{mag}_{m,n}$. Both conventions for $\text{index}_{m,n}$ aim at defining the position of the message $\mu_{v_c,c_m}$ that is processed. In the rest of the description, we will simply refer to it as the index of the variable-to-check message.

To each and every $c_m$, we associate a check node state (CNS), defined as $$CNS^\omega(c_m) = \{s_m; (mag_1, index_1), \ldots, (mag_k, index_k), \ldots, \quad (11)$$

$$mag_{d_c}, index_\omega)\}$$

$$\{s_m; MAG(\omega)\}$$

where $s_m = \prod_{n=1}^{d_c} \text{sign}_{m,n}$ is the value of the accumulated signs of the variable-to-check messages connected to CN $c_m$, which will be referred to as sign state in the rest of the description. MAC ($d_c$) is referred to as the magnitude state, and is composed of ω pairs.

A pair ($mag_k$, $index_k$) in the magnitude state will be referred to as a magnitude pair. Each magnitude pair is composed of the magnitude and the index of one of the $d_c$ incoming variable-to-check messages to the CNU. For simplicity of the presentation, we dropped the index m of the CN in the definition of the magnitude pairs. In a magnitude state, the magnitudes are sorted in ascending order:

$$mag_1 \le mag_2 \le \ldots \le mag_k \le \ldots \le mag_\omega$$

and the value of $index_k$ indicates the block-column index corresponding to the one where the message is equal to $mag_k$. We further assume, for ease of presentation, that each CN has at most one VN neighbor in each block-column of the parity-check matrix, i.e. $index_k \ne index_l$ if $k \ne l$. This condition is not mandatory for VL decoding, and the algorithm can be extended easily when a CN has more than one neighbor in the block-columns.

Throughout the description, we will describe the algorithms and the hardware architectures for the case of ω=2 smallest magnitudes, and we will use the notations CNS($c_m$) and MAC, dropping the parameter ω in the notations. Nonetheless, the current invention applies to VL decoders with other values of ω with minor modifications. The collection of all CNSs, for the M check nodes of the LDPC code, is stored in a memory called check node memory (CNM).

A general VL iterative decoder is presented in Algorithm 1. The algorithm takes as inputs the channel values, and produces the hard decision estimates $\hat{x}$.

The Initialization step of the algorithm serves to compute the initial values of the CNSs. During the initialization, all variable-to-check messages $\mu_{v_n,c_m}$ connected to VN $v_n$ are equal, computed from the channel value $y_n$.

After the initialization step, the decoder runs for a maximum of $It_{max}$ iterations. During one decoding iteration, the message update is performed block-column by block-column, until all block-columns in the PCM have been processed. In the algorithm, and without loss of generality, we assume that the block-columns are processed sequentially from the first to the last one.

During each block-column processing, the computation of the messages and the update of the CNSs are organized in three steps: the CNU-Generator step, the VNU step and the CNU-Updater step.

New check-to-variable messages $\mu_{c_m,v_n}$ are generated by the CNU-Generator using the values of the CNSs stored in the CNM, and the signs $sign_{m,n}$ of the variable-to-check messages $\mu_{v_n,c_m}$ from the previous iteration, which are stored in a memory. The newly generated messages are used by the VNU to compute the new values of the variable-to-check messages $\mu_{v_n,c_m}$. These new message values serve to update the CNSs using the CNU-Updater, and their signs are stored in the sign memory to be used during the next iteration.

Depending on the particular implementation of the algorithm and the type of variable node update $\Phi_v$, the initialization step and the VNU-step can change. For example, if FAID algorithm is used in the VL decoder, the initialization is performed with the direct channel outputs y, while if a min-sum algorithm is used in the VL decoder, the initialization is performed with the LLRs.

The hard-decision estimates $\{\hat{x}_n\}_{1 \leq n \leq N}$, which constitute the output of the algorithm, are computed during the VNU step. They are deduced from the APPs (8) using the messages $\mu_{c_m,v_n}$ generated during CNU-Generator, and after taking

---

Algorithm 1: VL iterative decoding

---

Input: channel values
Output: hard decision estimates $\{\hat{x}_n\}_{1 \leq n \leq N}$
Initialization: initialize the messages $\{\mu_{v_n,c_m}\}$ with the channel values and compute the CNS from the initialized messages,
for iter = 1 to $It_{max}$ do
  for j = 1 to $N_b$ do
    CNU-Generator
    for each variable node $v_n$ in block-column j,
    for each check node $c_m$ connected to variable node $v_n$
    read the check node state CNS($c_m$) = $\{s_m; MAG\}$
      (a) compute the temporary extrinsic sign: $\tilde{s} = s_m \cdot sign_{m,n}$
      (b) compute the input messages to the VNU: $\mu_{c_m,v_n} = \tilde{s} \cdot mag_1$ if $index_1 \neq j$; and $\mu_{c_m,v_n} = \tilde{s} \cdot mag_2$ if $index_1 = j$
    VNU:
      (c) compute the outputs of VNU $\mu_{v_n,c_m}$ from the input messages $\mu_{c_m,v_n}$ and the channel values, using the VNU function $\Phi_v$
    CNU-Updater
    for each variable node $v_n$ in block-column j,
    for each check node $c_m$ connected to variable node $v_n$,
    read the check node state CNS($c_m$) = $\{s_m; MAG\}$
      (d) compute the temporary extrinsic sign: $\tilde{s} = s_m \cdot sign_{m,n}$
      (e) compute mag* = $|\mu_{v_n,c_m}|$ and set index* = j
    compute the new check node state CNS($c_m$):
      (f) $s_m = \tilde{s} \cdot sign(\mu_{v_n,c_m})$
      (g) if $index_k$ in the truncated list MAG is equal to index*, remove ($mag_k$, $index_k$) from the list
      (h) insert (mag*, index*) in the sorted list MAG and truncate it to $\omega$ values.

--- the decision on the codeword bits using equation (9). If the hard-decision estimates verify the zero syndrome condition (10), then they form a valid codeword. The APP values can be computed at the end of the $It_{max}$ iterations, or alternatively can be computed during the decoding process, at the end of each iteration or at the end of each block-column processing. In case of a computation during decoding, the value of the syndrome H $\hat{x}$ can be used as an early stopping criterion. Whenever the syndrome is equal to 0, the decoder can be stopped since it has converged to a valid codeword.

As described in Algorithm 1, the CNM needs to be accessed several times during the iterative decoding. During each block-column processing, the CNU-Generator reads $d_v$ times L values of the CNSs, stored in addressed of the CNM corresponding to the block-rows that have non-zero CPMs in them. Similarly, the CNU-Updater accesses the CNM $d_v$ times in reading and $d_v$ times in writing, for each block-column processing. This represent in total $3d_vN_b$ accesses to this memory during one decoding iteration.

The CNM is a large memory, and the read/write (R/W) accesses to it represents a large portion of the total power consumed by the hardware architecture. The purpose of this invention is to reduce the number of accesses to the CNM, while still implementing an accurate VL decoding of the QC-LDPC code, without losing any error correction performance. We achieve this goal by proposing a specific LDPC code design, with an organization of the parity-check matrix in clusters of CPMs. The decoder architecture is implemented such that the modules, and especially the CNU-Updater, can process a collection of κ consecutive block-columns with less memory accesses than 3 d_κ. As a result, the invention targets a modified VL iterative decoder which will consume less power than the classical decoders, without scarifying on the error correction performance.

SUMMARY OF THE INVENTION

The present invention relates to a vertical layered iterative message passing algorithm to decode QC-LDPC codes.

The present invention relates to a method and hardware apparatus implementing vertical layered LDPC decoders targeting very low power consumption. This is achieved by designing a QC-LDPC code, for which the non-zero circulant permutation matrices (CPM) are placed at specific locations in the parity-check matrix of the code, forming concentrated clusters of CPMs.

The algorithm of the present invention passes messages from the variable nodes to the check nodes in the Tanner Graph of the LDPC code, updating the messages with variable node update (VNU) processors and check node updates (CNU) processors. The accumulated signs, the smallest magnitudes and the associated positions of the variable-to-check messages form the check node states (CNS), which are stored in a check node memory (CNM). The CNU is implemented in two steps, with two different processing units: the CNU-Generator and the CNU-Updater.

Specific implementations of the hardware modules of the decoder take advantage of the organization in clusters in order to reduce and minimize the number of read and write (R/W) accesses to the memories. For example, when processing a cluster of κ consecutive CPMs, the CNU-Generator reads the check node memory only once instead of κ times; and the CNU-Updater reads one time and writes one time in the check node memory instead of κ reads and κ writes. This gives a factor of κ reduction in the number of accesses to the check-node memory. The larger the size of the clusters κ is, the larger the power saving will be.

Thanks to the reduction of R/W accesses, we propose to process simultaneously several CPMs using a single instance of the CNU-Updater. This can be achieved at the condition that the clusters of CPMs are placed at specific locations within a higher-order generalized layer. A higher-order generalized layer of order μ is defined by a sub-matrix of the parity-check matrix, containing at most μ CPMs in the block-column of the sub-matrix defining the generalized layer.

Within a higher-order generalized layer of order µ, the placement of clusters needs to follow a particular constraint, called non-colliding clusters (NCC) constraint. This constraint ensures that no two clusters have their last CPM in the same block-column, allowing the CNU-Updater to process multiple (up to µ) clusters in parallel.

We furthermore add the constraint that the set of clusters in a higher-order generalized layer of order µ can be decomposed into µ groups of non-overlapping clusters. Within a cluster group, no two clusters can have a CPM in the same block-column of the generalized layer. The organization of clusters into non-overlapping groups allows the efficient instantiation of the CNU-Updater hardware.

We describe several preferred embodiments of the invention, depending on the cluster size κ and the generalized layer order µ, each of which following the NCC constraint. The preferred embodiments are denoted NCC(κ, µ), and we illustrate examples for the preferred cases NCC(2, 2), NCC (3, 2), NCC(3, 3), NCC(4, 4), NCC(6, 4) and NCC(8, 4).

In order to achieve the reduction of R/W accesses, the apparatus for the CNU-Updater makes use of specific units, called Pre-Updaters which are updating local check-node states corresponding only to the CPMs inside a cluster, before updating the CNSs in the check-node memory at the end of the cluster processing. In a CNU-Updater for an order-µ generalized layer, there are µ Pre-Updaters, each one in charge of a group of non-overlapping clusters. Similarly, the CNU-Updater is using µ local Sign Accumulators to process in parallel the sign states of the CNS for the µ groups of clusters.

The present invention includes an Initializer module, which is in charge of computing the syndrome bits from the channel values. The syndrome bits are used to initialize the signs states of the CNSs before the first decoding iteration. The apparatus for the Initializer is impacted by the organization in clusters, and is implemented using µ local Sign Accumulators, one for each cluster group inside a higher-order GL.

The present invention includes also a Validator module, used to compute on the fly the syndrome bits of the hard decision estimates, and to stop the decoder whenever the syndrome is all-zero. In order to compute accurately the syndrome bits, stored in a Syndrome Memory, the apparatus for the Validator module computes for each higher-order GL full cluster syndromes and partial cluster syndromes. The partial cluster syndromes correspond to the value of the syndrome bits when the processed clusters are not finished. The Validator module then combines the full cluster syndrome and the partial cluster syndromes to compute the syndrome of the whole code and take the decision to stop the decoder when the whole code syndrome is all-zero.

BRIEF DESCRIPTION OF THE DRAWINGS

For a more complete understanding of the invention, reference is made to the following description and accompanying drawings, in which.

DETAILED DESCRIPTION OF THE INVENTION

The method in the present invention relates to an iterative message-passing LDPC decoder operating on a QC-LDPC code, whose parity-check matrix consists of circulant permutation matrices of size L×L. For a parity-check matrix with $N_b$ block-columns and $M_b$ block-rows, the j-th block-column contains $d_v(j)$ CPMs, and the i-th block-row contains $d_c(i)$ CPMs. For simplicity of the presentation, and when the context is clear, the indices i and j will be dropped from these notations.

The message-passing decoder of the present invention follows a vertical layered (VL) scheduling, in which the main processing modules are a variable node update (VNU) processor and a check node update (CNU) processor. The CNU processor is itself composed of two main modules: the CNU-Generator and the CNU-Updator. We can refer to Algorithm 1 for more details. The VL decoder processes the $N_b$ block-columns of the QC-LDPC code in an arbitrary order, during one decoding iteration. We assume without loss of generality that the block-columns are processed sequentially from index j=1 to index $j=N_b$.

During one decoding iteration, the current block-column will be denoted as the processed block-column. Furthermore, each block-column is composed of a set of L variable nodes, which will be denoted as processed VN group. In each block-column, there are $d_v$ CPMs located in different block-rows. In a processed block-column, the CPMs are denoted processed CPMs, and the corresponding block-rows as processed block-rows. The set of L CNs in a processed block-row is called processed CN group. In each processed block-row, the set of L CNSs is denoted CNS group. A CNS group is composed of a sign state group and a magnitude state group.

All modules in the hardware implementation of the current invention will process groups of L data in parallel, accepting groups of L data as inputs and producing groups of L data as outputs. The type of data could be messages, syndrome bits, codeword bits, or check node states, depending on the module.

Figure 1:
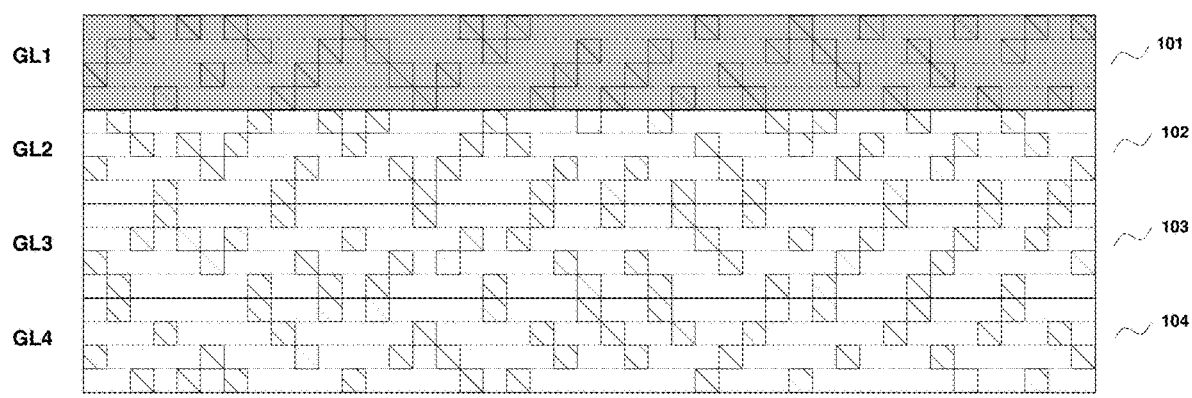
FIG. 1 shows the organisation of the parity-check matrix of a QC-LDPC code in Generalized Layers. Each Generalized Layer contains at most one circulant permutation matrix in each block-column.
Figure 2:
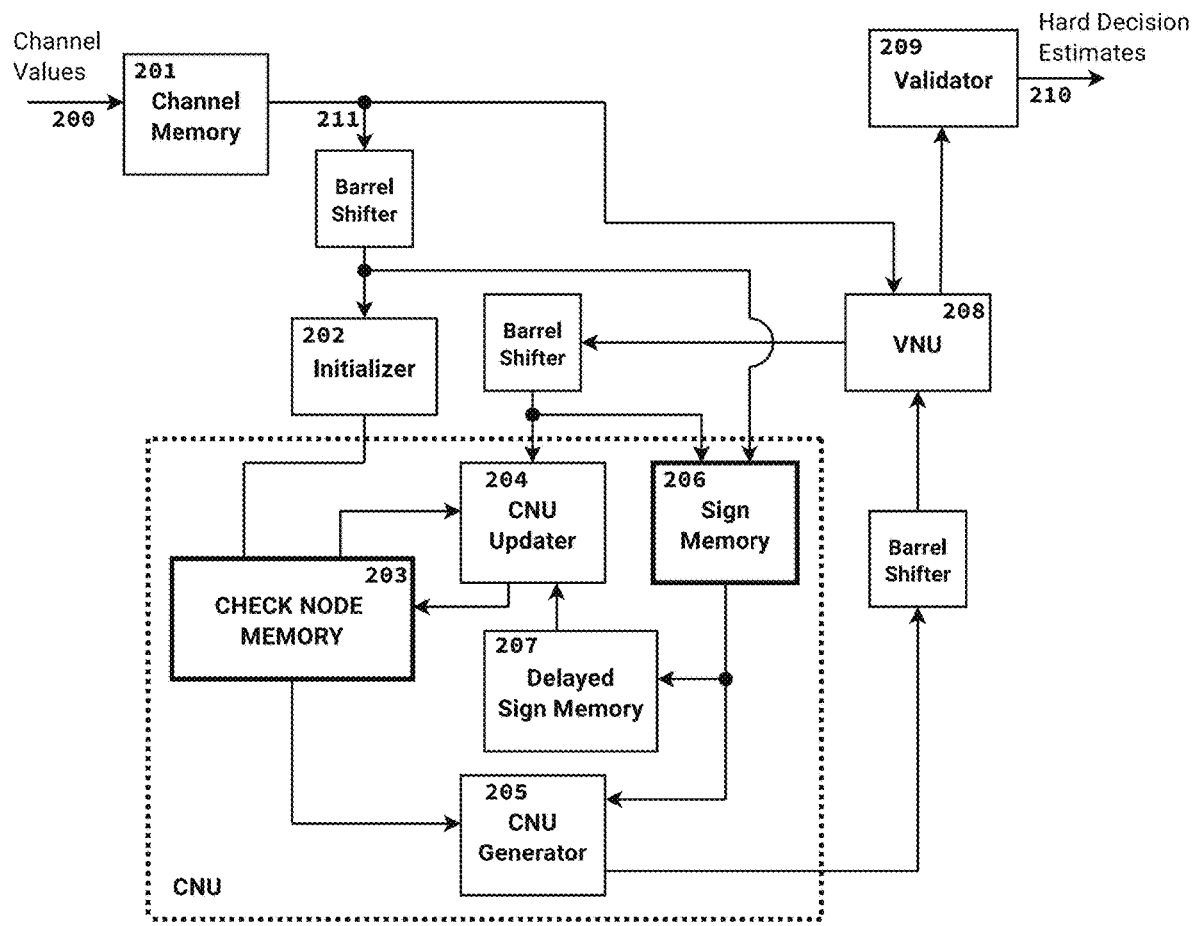
FIG. 2 shows an apparatus for the Top Level architecture of a VL decoder.

An apparatus for the top level architecture of the VL decoder proposed in this invention is depicted on FIG. 2. The Check Node Memory 203 stores the check node states $CNS(c_m)$ for all check nodes in the LDPC code. Each $CNS(c_m)$ is composed of the sign state $s_m$ of the corresponding check node, and the magnitude state $MAG(\omega)$, which contains $\omega$ pairs of $(mag_k, index_k)$. We will restrict the presentation of the invention to $\omega=2$ although it applies also to other values of $\omega$ with minor variations. For simplicity, we will denote $MAG(2)=MAC$. The sign memory 206 stores the signs $sign_{m,n}$ of the variable-to-check messages $\mu_{v_n, c_m}$. Consequently, there is one sign for each edge connecting a VN to a CN.

At the beginning of the decoding procedure, the Initializer module 202 takes groups of L channel values 200 as inputs, and uses them to initialize the CNSs in the CNM. It computes the initial sign states $s_m$ for all CNs, and the initial values of the magnitude states, which depend only on the magnitudes of the channel values. Alternatively, the initial magnitude states could be set by the Initializer to fixed, predetermined values. The initial sign states are either stored in a local memory, called Syndrome Memory, in the Initializer module, or directly stored in the CNM. During initialization, the channel signs are copied as initial values of the variable-to-check message signs, which are stored in the sign memory 206. After the initialization is performed, the CNM contains the initial values of the CNSs $\{s_m; MAG\}$.

After initialization, the CNU and the VNU processors exchange messages iteratively, through the Barrel Shifter units. The barrel shifters re-order the messages addresses according to the CPMs of the QC-LDPC code. A Barrel Shifter unit is composed of a maximum of $d_{v,max}$ barrel shifters, which can process all messages within a block-column in parallel.

For a processed block-column of degree $d_v$, the decoder proceeds as follows. The CNU-Generator 205 reads $d_v$ CNS groups from 203 and $d_v$ groups of message signs from the sign memory 206 to compute the check-to-variable messages groups. The details of the CNU-Generator architecture are given later in the description. The check-to-variable messages $\mu_{c_m, v_n}$ are then cyclically shifted according to the CPMs of the processed block-column, and serve as inputs to the VNU processor.

The VNU processor 208 receives $d_v$ check-to-variable messages groups and the channel values group corresponding to the processed block-column. It computes $d_v$ variable-to-check messages $\mu_{v_n, c_m}$ groups using the VNU function $\Phi_v$, according to equation (5), which are then cyclically shifted and sent to the CNU-Updater 204. The barrel shifted signs of the newly computed variable-to-check messages are also stored in the Sign Memory 206.

The CNU-Updater uses as inputs the variable-to-check messages from 208, the associated CNSs from 203 and the corresponding delayed signs from 207, and computes the new CNSs which are written in the CNM 203. The details about the functioning of the CNU-Updater are given later in the description.

Note that the signs that are needed to update the CNSs are the ones of the corresponding variable-to-check message $\mu_{v_n, c_m}$, but from the previous decoding iteration. However, due to pipelining in the architecture, it can take several clock cycles for the messages that are generated by the CNU-Generator to flow through the Barrel Shifter unit, the VNU and through the second Barrel Shifter unit, before arriving at the CNU-Updater input. Consequently, the CNU-Updater updates the CNS using messages from block-columns that are delayed compared to the current processing block-column. The signs corresponding to the delayed block-columns have been overwritten in the Sign Memory 206 with new signs from the current iteration. In order to update the CNSs with the correct signs from the previous iteration, we added a Delayed Sign Memory 207 that is used as input to the CNU-Updater module.

The computation and updating of messages and CNSs described above is repeated block-column by block-column until the entire parity-check matrix has been traversed which then constitutes one decoding iteration. Then, the decoding process starts again from the first block-column in the next decoding iteration.

The VL decoder in this invention is also equipped with a stopping criterion which allows us to output a valid codeword after any block-column processing. In order to do so, the VNU processor also computes APP values following (8) for all VNs in the processed block-column and computes hard-decision estimates $\hat{x}$. The hard-decision estimates are sent to the Validator module 209 to check if the decoder has converged to a valid codeword. The Validator computes the syndrome bits of the LDPC code with the most recent values of $\hat{x}$ received from the VNU processor, which are stored in a Syndrome Memory. The Validator stops the decoding whenever the syndrome bits are all zero (following Eq. (10)), meaning that the hard-decision estimates $\hat{x}$ form a valid codeword 210.

In this invention, we propose to split the memories that store information about the CNs into one or several pieces, with the objective of reducing the number of R/W accesses in each memory piece to its minimum. This concerns the CNM 203 in the CNU processor, and the Syndrome Memories in the Initializer 202 and in the Validator 209.

Let us take the example of the CNM, and let $\Gamma$ be the number of pieces composing the CNM. Each memory piece $CNM^{(\gamma)}$, $\gamma=1, \ldots, \Gamma$, is associated to a set of CNs, and therefore a set of block-rows of the parity-check matrix. The submatrix associated with the $\gamma$-th memory piece is denoted $H^\gamma$. Whenever the decoder processes a CPM that is located in $H^\gamma$, it will access data in the piece $CNM^{(\gamma)}$.

The number of pieces in which the CNM is split has a direct impact on the implementation of the hardware units of the CNU processor. Since there are $\Gamma$ pieces of the CNM, the CNU-Updater 204 and the CNU-Generator 205 are composed of $\Gamma$ units processing in parallel the CPMs for each submatrix $H^\gamma$.

The purpose of splitting the CNM into several pieces is to allow each of the $\Gamma$ units in the CNU processor to access their data from an independent memory, at the same time. This can only be achieved is the CPMs in the QC-LDPC code are placed at specific locations. Similarly, the Initializer module 202 is in charge of computing the initial values of the sign states, which are equal to the syndrome bits, stored in a Syndrome Memory. Since there are $\Gamma$ pieces of the Syndrome Memory, there are $\Gamma$ units computing in parallel the syndrome bits from the channel signs.

Finally, the Validator module 209 computes the syndrome bits from the hard-decision estimates and stores them in a Syndrome Memory. There are also $\Gamma$ units in the Validator, computing in parallel the syndrome bits.

In a classical QC-LDPC code, the submatrix $H^\gamma$ is usually defined as either a layer or a generalized layer, which contain at most one CPM per block-column of the submatrix.

In the present invention, we introduce the new concept of higher-order Generalized Layer, or order-$\mu$ Generalized Layer (order-$\mu$ GL). The definition is a direct generalization of the classical generalized layers:

An order-$\mu$ generalized layer is defined as the concatenation of block-rows of H, such that in each block-column of the submatrix defined by the higher-order generalized layer, there is at most $\mu$ non-zero CPMs while the other blocks are all-zero blocks.

A full order-$\mu$ generalized layer has further the property that each block-column contains exactly $\mu$ non-zero CPMs.

An order-1 GL is a classical generalized layer. From the definition, it follows that the vertical concatenation of $\mu$ generalized layers form an order-$\mu$ generalized layer. However, an order-$\mu$ generalized layer cannot always be decomposed into $\mu$ generalized layers.

Figure 3:
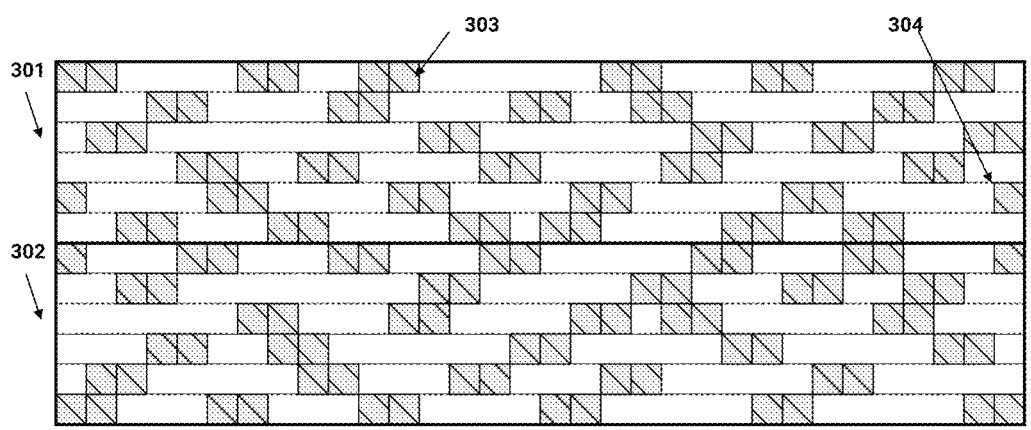
FIG. 3 shows the organization of the the parity-check matrix of a QC-LDPC code in higher order Generalized Layers and concentrated clusters of CPMs. We show the particular example of two order-2 GLs, composed of 2-clusters.

FIG. 3 shows the organization of a regular $d_v=4$ QC-LDPC code with two order-2 GLs. Note that in this example, the higher-order GLs are full order-2 GLs. In the rest of the description, we will refer to an higher-order GL simply as GL, for any order $\mu$, since the context clearly indicates the number of CPMs in each block-column. In this invention, the submatrices $H^\gamma$ associated with the memory pieces correspond to order-$\mu$ GLs, with a special focus on GLs with orders $\mu \in \{2, 3, 4\}$.

In order to minimize the number of R/W accesses to the memory piece corresponding to a submatrix $H^\gamma$, the CPMs must be localized in a very specific way. They have to be concentrated in clusters of CPMs such that the modules can process multiple CPMs with a limited number of memory accesses.

Let us define a $\kappa$-cluster of CPMs by a $\kappa$-uple of consecutive non-zero CPMs in a block-row of a submatrix:

$$H_{m,1:\kappa}=[H_{m,1},H_{m,2},\ldots,H_{m,\kappa}] \quad (12)$$

where $H_{m,k}$ is a non-zero CPM.

More generally, a $\kappa$-cluster of CPMs could contain less than $\kappa$ non-zero CPMs within the cluster. For example, a $\kappa$-cluster with two all-zero blocks and $\kappa-2$ non-zero CPMs could have the following structure:

$$H_{m,1:\kappa}=[H_{m,1},0,H_{m,2},\ldots,0,H_{m,\kappa}] \quad (13)$$

When a $\kappa$-cluster is full of CPMs, we will refer to it as $\kappa$-cluster or full $\kappa$-cluster, otherwise it will be referred to as a sparse $\kappa$-cluster. The objective of this organization of CPMs is to reduce to the minimum the number of required R/W accesses to the memories while processing the $\kappa$-cluster. The maximum hardware efficiency is achieved when the matrix is organized in full clusters, in which case we have a minimum number of memory accesses for a given number $\kappa$ of processed CPMs. We will discuss only the case of full clusters in the rest of the description. The generalization of the hardware modules to sparse $\kappa$-clusters follows easily. The organization of CPMs in concentrated clusters has an impact on the hardware realization of the Initializer, of the CNU processor, and of the Validator.

In an order-$\mu$ GL, the $\kappa$-clusters need to be placed at very specific locations in order to avoid memory access port violations.

[NCC] We impose the constraint that two or more clusters cannot end at the same block-column in the higher-order GL. We call this constraint non-colliding clusters (NCC) constraint.

We will assume throughout this description that the clusters in an order-$\mu$ GL follow the NCC constraint.

In several preferred embodiments of this invention, the clusters in a higher-order GL have the same size $\kappa$. Note that thanks to the definition of sparse clusters, any full cluster of size $\kappa$ can be seen as a sparse $\kappa'$-cluster with $\kappa'>\kappa$ by appending $\kappa'-\kappa$ zero blocks to the cluster. In a full order-$\mu$ GL with constant size clusters, the NCC constraint ensures that clusters do not end at the same block-column, but also do not start at the same block-column. Furthermore, a full order-$\mu$ GL cannot be composed of $\kappa$ clusters with $\kappa<\mu$, otherwise this would violate the NCC constraint.

It results that in a full order-$\mu$ GL that follows the NCC constraint, we can split the set of $\kappa$-clusters into $\mu$ non-overlapping groups of clusters. For each group of non-overlapping clusters, there is at most one CPM in each block-column of the corresponding submatrix. In the preferred embodiments where the order-$\mu$ GL is full, for each group of non-overlapping clusters, there is exactly one CPM in each block-column.

Figure 4:
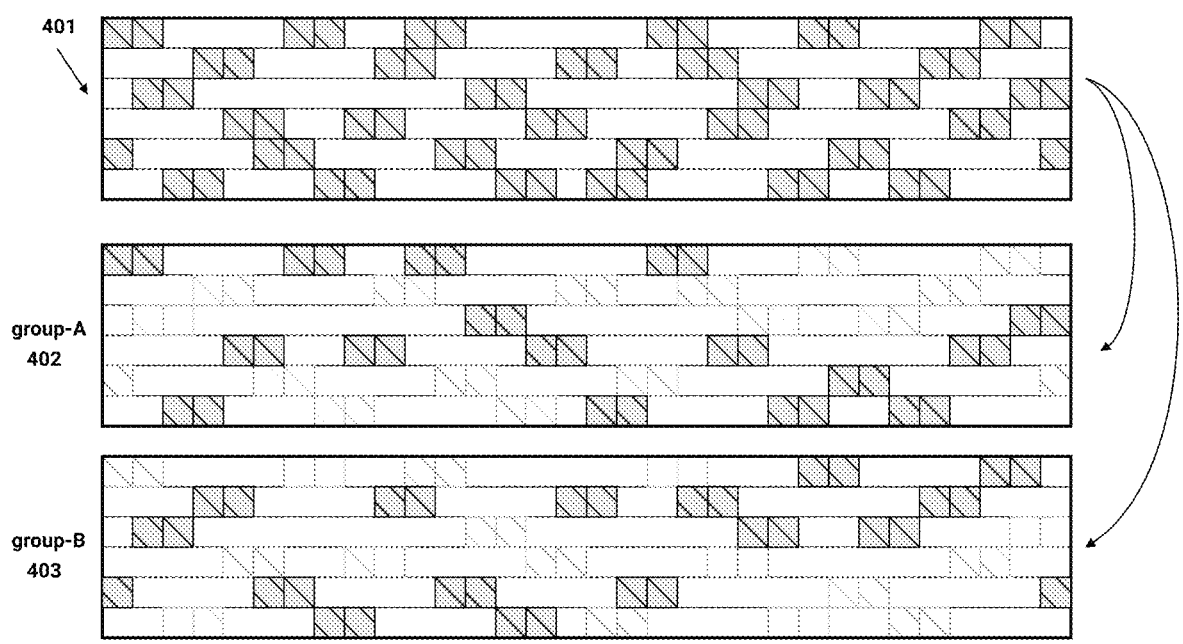
FIG. 4 shows the organization of an order-2 GL with 2-clusters belonging to two non-overlapping groups.

FIG. 4 shows the organization of 2-clusters into two groups of clusters, denoted group-A 402 and group-B 403, in the case of a full order-2 GL. The organization of clusters into non-overlapping groups will be used for the efficient instantiation of the hardware implementation of the Initializer, the CNU processor, and the Validator.

The organization of CPMs into clusters allows us to limit the number of R/W accesses to the CNM memory in the CNU-Updater, and to the Syndrome Memories in the Initializer and in the Validator. We read from these memories at the beginning of each processed cluster, and write to these memories at the end of each processed cluster, instead of doing the R/W for each CPM. For each cluster of size $\kappa$, the number of R/W accesses is reduced from $2\kappa$ to only 2. The reduction of R/W accesses creates free time slots during which the memories are not accessed, and that can be used to process simultaneously other clusters in the same block-column of the submatrix $H^\gamma$. As a result, the organization of CPMs in clusters allows us to consider submatrices that have more than one CPM per block-column, still being able to process all CPMs in a block-column simultaneously, without memory access conflicts.

We now discuss several preferred embodiments of the invention, which relate to particular organizations of the clusters inside a higher-order GL. The length $\kappa$ of the clusters and the order $\mu$ of the higher-order GL define each preferred embodiment, and the clusters are assumed to follow the NCC constraint. We will denote by NCC($\kappa$, $\mu$) the preferred embodiment describing the structure of a higher-order GL.

Note that the present invention is applicable to any cluster size, and any GL order. In addition, when the higher-order GL contains sparse clusters, $\kappa$ and $\mu$ represent actually maximum values, instead of actual values, for the cluster length and GL order. The preferred embodiments will be presented assuming full clusters only, and full higher-order GL only, in which case we must have $\kappa \geq \mu$. The generalization to sparse clusters, and to non-full higher-order GLs follows easily.

Let us also note that we can combine GLs with different orders to form QC-LDPC codes with various VN degrees. For example, we can combine a full NCC(3, 3) GL and a full NCC(3, 2) GL to obtain a regular QC-LDPC code with constant VN degree $d_v=5$. When using sparse clusters instead of full clusters in this example, the GLs will not be full anymore, and we can build an irregular QC-LDPC code with VN degrees $d_v \in \{3, 4, 5\}$. The obtained irregular QC-LDPC will be composed of 2 higher-order GLs, following the NCC constraint.

A first preferred embodiment of this invention concerns the case of full clusters of size $\kappa=2$ in an order-2 GL, denoted NCC(2, 2). We give an illustration following the preferred embodiment NCC(2, 2) in FIG. 3 for a $d_v=4$ regular QC-LDPC code with $\Gamma=2$ GLs of order $\mu=2$. For each order-2 GL, there are exactly 2 CPMs, as well as one cluster starting and one cluster ending, in each block-column. We can also note that we enforced the NCC property to be tail-biting: the cluster indicated in 304 starts in the fifth block-row and last block-column, and ends in the same block-row and first block-column. This is a desirable property since at the end of one iteration of the VL decoder, we will process the last block-column of the PCM, followed by the first block-column of the PCM. The cluster organization and the NCC constraint needs also to be fulfilled during this transition.

Note that although the tail-biting property of the cluster organization is preferred, this is not mandatory. In the case where a started cluster at the end of the matrix does not finish cyclically at the beginning of the same block-row, the decoder can introduce pauses between iterations to ensure that the NCC constraint is fulfilled, and that no memory access port violations occurs. When the tail-biting property is enforced, no pause is necessary between decoding iterations.

Figure 5:
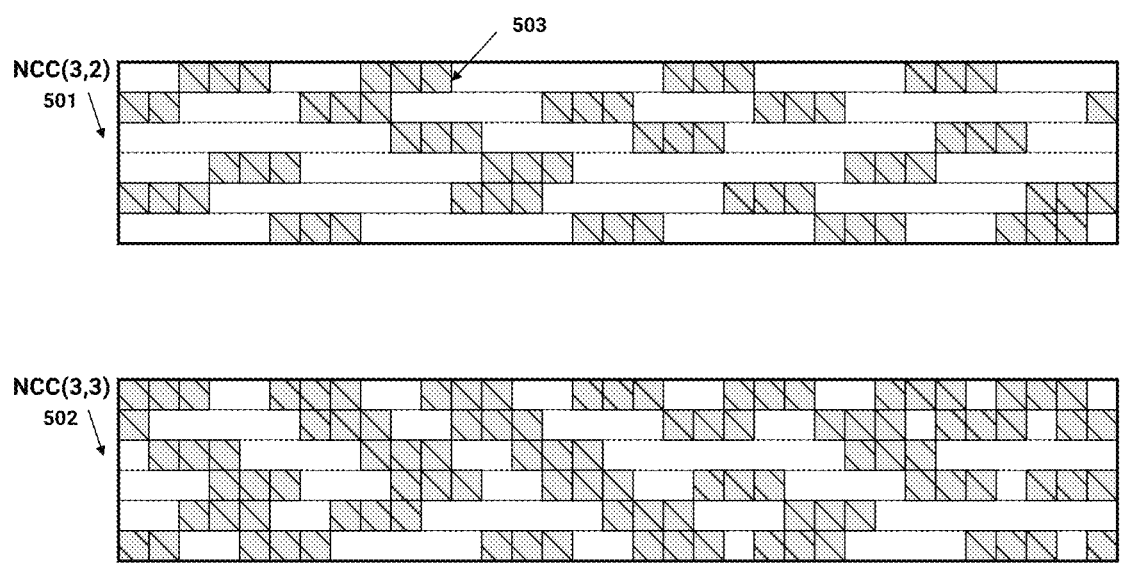
FIG. 5 shows the organization of an order-2 GL and an order-3 GL, both composed of 3-clusters.

In FIG. 5, we show illustrative examples for the preferred embodiments NCC(3, 2) and NCC(3, 3). The preferred embodiment denoted NCC(3, 2), shown in 501, is composed of clusters with length $\kappa=3503$. The clusters are organized such that they form a full order-2 GL. In each block-column there are exactly 2 non-zero CPMs, belonging to 2 non-overlapping groups of clusters. In this preferred embodiment, the block-columns do not all see the same cluster organization. Let us take three consecutive block-columns in 501, for example block-columns $j=3$, $j=4$ and $j=5$. In block-column $j=3$, one cluster starts and the other one ends. In block-column $j=4$, one cluster starts and the other one is in the middle. Finally, in block-column $j=5$, one block-column ends and the other one is in the middle. This pattern of 3 consecutive block-columns is repeated in the whole higher-order GL.

The preferred embodiment denoted NCC(3, 3) is shown in 502. The order-3 GL is composed of clusters with length $\kappa=3$, which are split into 3 non-overlapping groups. Like in the other embodiments, the cluster organization and NCC constraint are tail-biting: a 3-cluster starts at the end of block-row 2 and finishes at the start of the same block-row, and similarly in block-row 6. In this preferred embodiment, in each and every block-column, the cluster in one group starts, the cluster in another group ends, and the cluster in the last group is in the middle.

Figure 6:
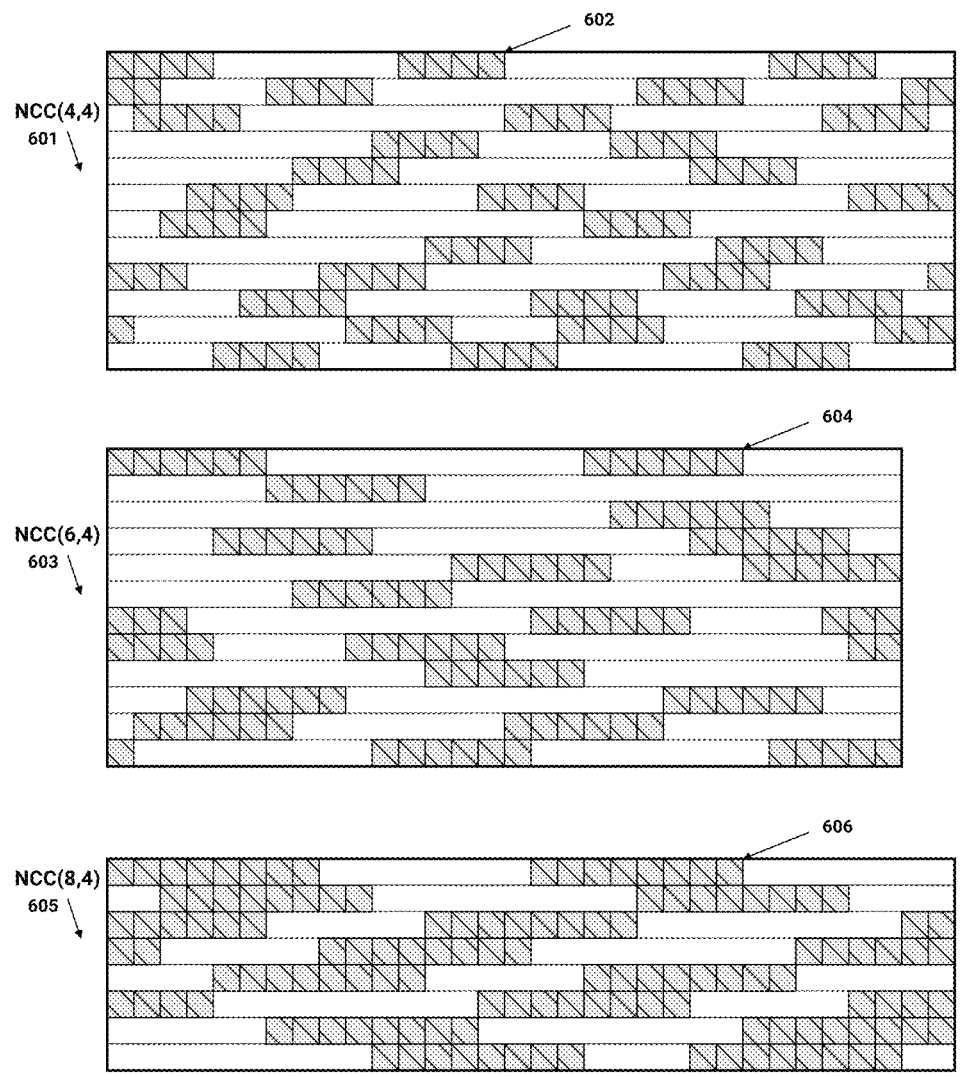
FIG. 6 shows the organization of order-4 GLs with different cluster lengths. We show the examples of 4-clusters, 6-clusters and 8-clusters.

In FIG. 6, we show illustrative examples with larger clusters, composing an order-4 GL. In the preferred embodiment denoted NCC(4, 4), shown in 601, the clusters have lengths $\kappa=4$. The order-4 GL is composed of 4 non-overlapping cluster groups. This GL follows the NCC constraint, which is enforced in a tail-biting fashion. In each and every block-column, there is one cluster starting, one cluster ending, and the other two in the middle.

In the preferred embodiment denoted NCC(6, 4), shown in 603, the clusters have lengths $\kappa=6$ and form an order-4 GL following the NCC constraint. We have therefore 4 non-overlapping groups in this preferred case.

Finally, the preferred embodiment denoted NCC(8, 4) is shown in 605. In this case, the order-4 GL is composed of length $\kappa=8$ clusters, arranged in 4 non-overlapping groups.

Let us now describe in details the implementation and functioning of the modules in the decoder architecture that are affected by the organization in clusters. This concerns the Initializer module 202, the CNU-Updater 204 in the CNU processor, the CNU-Generator 205 in the CNU processor, and finally the Validator module 209. The other parts of the architecture follow the principles of a generic iterative VL QC-LDPC decoder, and are not affected by the organization in clusters of CPMs.

In a preferred embodiment of the Initializer apparatus, the initial magnitude states of the CNS are set to fixed, predetermined values, and the Initializer module is only in charge of computing the the initial syndrome bits, which are used as initial values of the sign states in the CNSs. The initial sign states are equal to the syndrome bits computed from the channel signs.

The Initializer module is composed of $\Gamma$ units processing in parallel the $\Gamma$ higher-order GLs. We will describe the functioning of one unit, which is in charge of computing the syndrome bits of a single order-$\mu$ GL.

One unit of the Initializer takes as inputs groups of L channel signs corresponding to the VNs in the processed block-columns. Since there are $\mu$ CPMs in each block-column of the higher-order GL, the L channel signs are first barrel-shifted in accordance with the $\mu$ CPM shift values, and the $\mu$ groups of shifted signs are used in the Initializer to compute the syndrome bits of the corresponding block-rows.

The incoming signs groups belonging to a $\kappa$-cluster are accumulated using Sign Accumulator units, which are used to compute local syndrome bits corresponding only to the channel signs associated with the $\kappa$-clusters. The local syndrome bits groups produced by the Sign Accumulator units are then used in the Initializer to compute the full syndrome.

Figure 7:
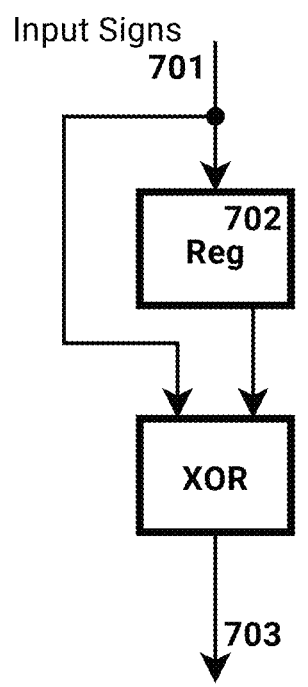
FIG. 7 shows an apparatus for the architecture of a Sign Accumulator for (a) 2-clusters and (b) κ-clusters. The Sign Accumulators are used in the Initializer, the CNU-Updater, and the Validator.
Figure 7:
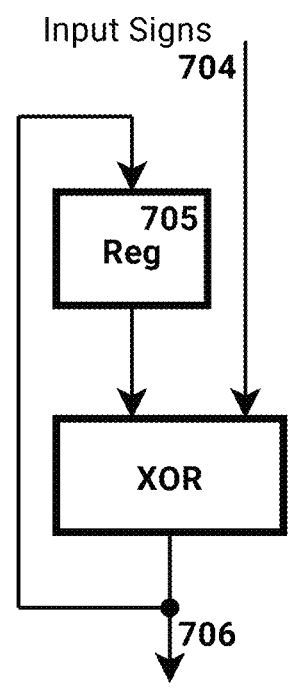

Let us first describe the functioning of the Sign Accumulators. FIG. 7-(a) shows a Sign Accumulator unit in the case of clusters of size $\kappa=2$ and FIG. 7-(b) shows a Sign Accumulator unit in the case of $\kappa>2$.

For 2-clusters, the Sign Accumulator unit receives two channel signs groups, sequentially. The signs group corresponding to the first CPM of the cluster is stored in a register 702 and is xored with the signs group corresponding to the second CPM of the cluster, in order to obtain the local syndrome bits group 703 of the processed cluster. When the cluster size is large with $\kappa>2$, it is more efficient to implement a recursive computation of the syndrome bits group for the block-row containing the processed cluster. In FIG. 7-(b), the input of the register 705 is the output of the XOR unit, to implement the recursive accumulation of signs. Before processing a cluster, the content of the register is set to 0. When the channel signs shifted by the first CPM of the cluster arrive at the input of the unit, they are therefore copied into the register, since they are xored with 0's. For the subsequent CPMs of the processed cluster, the register contains the accumulated local syndrome bits of the processed block-row, corresponding to the processed cluster only. The local syndrome bits group 706 is obtained at the output of the XOR when the signs group of the last CPM of the processed cluster arrive at the input of the unit.

Figure 8:
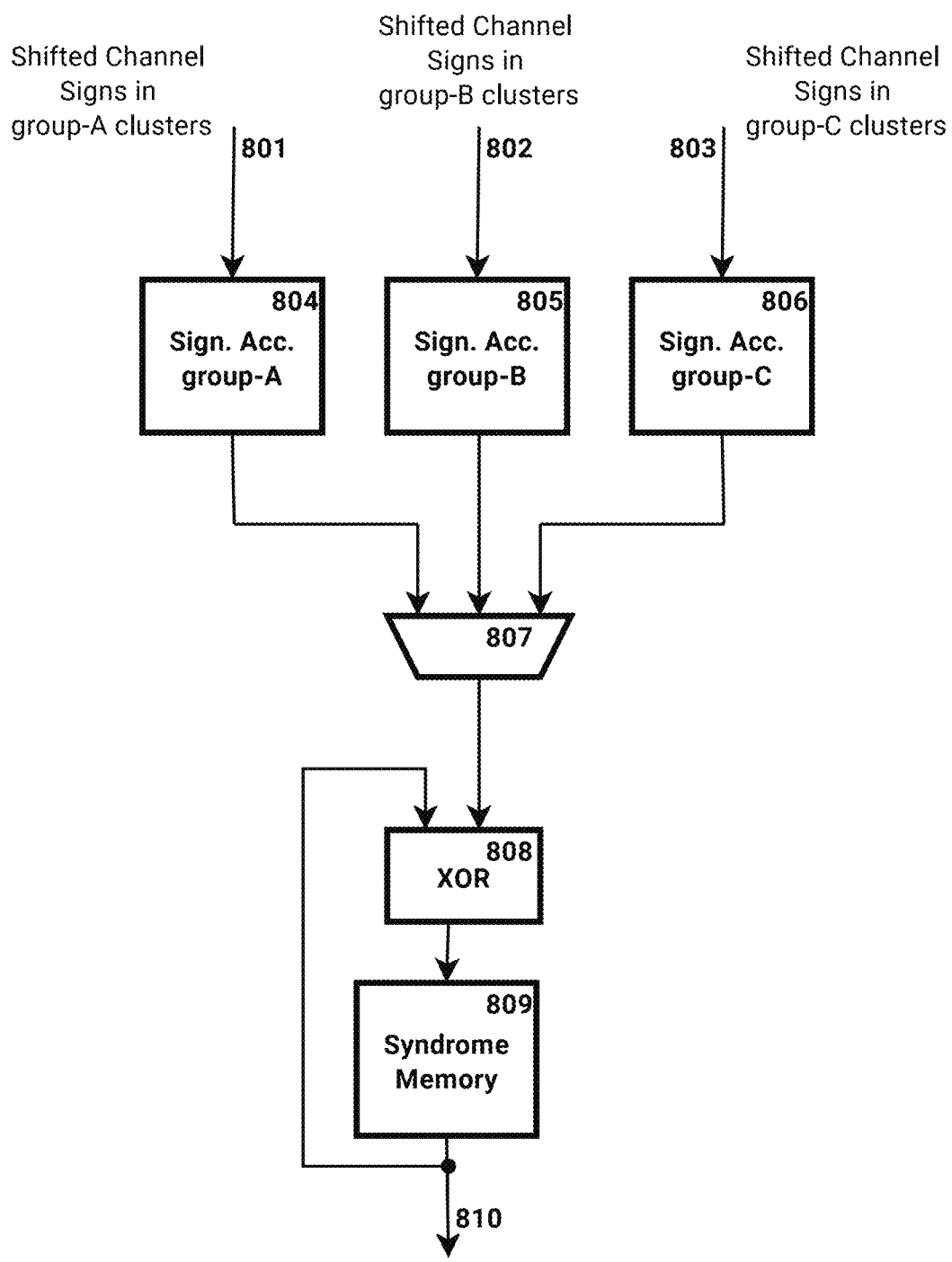
FIG. 8 shows an apparatus for the architecture of the Initializer Syndrome Calculator. The case of an order-3 GL with κ-clusters is shown.

As an illustrative, non-limiting example, FIG. 8 shows the architecture of the Initializer syndrome bits calculator in the case of $\mu=3$. The clusters in the higher-order GL are organized in 3 non-overlapping groups, named group-A, group-B and group-C. The first input 801 corresponds to the channel signs shifted by the CPM of the group-A cluster in each block-column, the second input 802 corresponds to the channel signs shifted by the CPM of the group-B cluster in each block-column, and finally, the third input 803 corresponds to the channel signs shifted by the CPM of the group-C cluster in each block-column.

The fact that the three inputs 801-803 belong to different cluster groups ensures that the channel signs associated with a given cluster group always arrive at the input of the same Sign Accumulator unit. Therefore, the Sign Accumulator units 804-806 compute effectively the local syndrome bits associated with the clusters of their designed cluster group, in $\kappa$ successive steps. By virtue of the NCC constraint in an order-$\mu$ GL, only one cluster among the three groups has its last CPM in a given block-column. Let us assume that the cluster in group-A ends at block-column j. When processing block-column j, the Sign Accumulator for group-A 804 has finished the computation of the local syndrome bits group, which is selected by 807 and sent to the XOR 808 to be combined with the content of the Syndrome Memory 809 for the processed block-row. The output of the XOR contains the updated syndrome bits corresponding to all previously processed clusters in the processed block-row. The Sign Accumulator for group-B and group-C continue to accumulate their local syndrome bits, since at block-column j, the clusters in groups B and C have not ended.

Once all block-columns in the entire matrix have been processed, the syndrome bits stored in the Syndrome Memory 809 are output and used to initialize the signs states of the CNM, for the corresponding higher-order GL. Although we described only specific examples of cluster sizes and GL orders in FIG. 8, the same principle applies to higher-order GLs of any size $\mu \geq 1$ and to clusters of any size $\kappa \geq \mu$.

As shown in the apparatus of the top level architecture in FIG. 2, the Check Node Update processor is composed of two processing units: the CNU-Updater and the CNU-Generator. Each of these units is composed of $\Gamma$ units processing in parallel the $\Gamma$ higher-order GLs. We describe thereafter the functioning of a single unit, in charge of processing a single higher-order GL.

Let us first discuss the CNU-Generator module. In each order-$\mu$ GL, there are $\mu$ message generator units processing in parallel the $\mu$ groups of non-overlapping clusters. Each of the message generator units is in charge of reading the CNS group in the CNM, then reading the message signs groups from the previous iteration in the Sign Memory, and determining the signs and magnitudes of the check-to-variable messages groups sent to the VNU processor.

The CNU-Generator proceeds as follows. For a cluster of size $\kappa$, the message generator unit reads the associated CNS $\{s_m; MAG\}$ when the cluster starts, and generates $\kappa$ groups of L check-to-variable messages, in $\kappa$ successive steps. For each CPM in the cluster, the signs of the check-to-variable messages are computed as the XOR between the signs from the previous iteration and the values of the sign states $s_m$ of the CNSs. The magnitudes of the check-to-variable messages are equal to one of the two smallest magnitudes ($mag_1$, $mag_2$) of the magnitude states MAC, and are determined the following way. The magnitudes will be equal to the second smallest magnitude $mag_2$, if the index of the output message matches $index_1$, or equal to the first smallest magnitude $mag_1$ otherwise. The L check-to-variable messages of each processed CPM in the cluster are then sent out to the VNU through the Barrel Shifters.

The VNU processor receives the check-to-variable messages groups and the channel values group corresponding to the processed block-column, and computes the variable-to-check messages groups that are sent to the CNU-Updater.

The CNU-Updater is in charge of computing the new CNSs, using the newly computed variable-to-check messages coming from the VNU. The module is composed of two parts: a magnitude states CNU-Updater and a sign states CNU-Updater.

Figure 9:
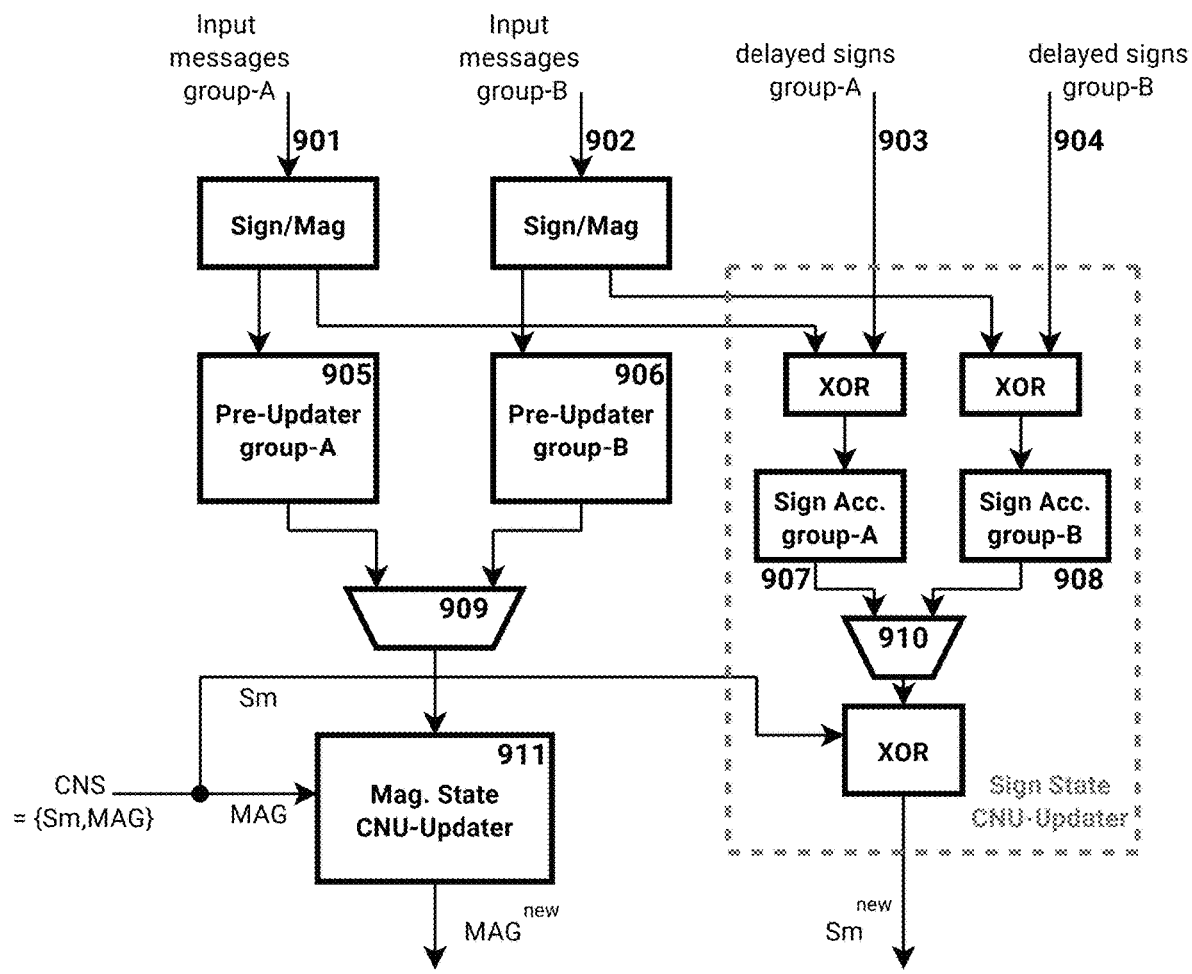
FIG. 9 shows an apparatus for the architecture of the CNU-Updater, for an order-2 GL and clusters of any size κ.

In FIG. 9, we show the architecture of a CNU-Updater in the case of a higher-order GL with order $\mu=2$. The clusters are organized in 2 non-overlapping groups, denoted group-A and group-B. The CNU-Updater takes as inputs groups of L variable-to-check messages coming from the VNU module. One group 901 corresponds to the group-A clusters and the other group 902 corresponds to the group-B clusters. The delayed signs groups 903-904 coming from the memory 207 corresponding to these messages are also input to the CNU-Updater.

We discuss only the preferred embodiments where the CNS is composed of $\omega=2$ magnitude pairs.

For each cluster group, the magnitudes of the input messages enter into Pre-Updater units 905-906. The Pre-Updater units are used to compute the local magnitude states $MAG^* = \{(mag_1^*, index_1^*); (mag_2, index_2^*)\}$, which correspond to the two smallest magnitudes and the corresponding indices, for the messages in the processed clusters only. More precisely, for a cluster of size $\kappa$, there are $\kappa$ incoming variable-to-check messages from the VNU for each CNS in the processed block-row. The Pre-Updater computes and sorts the 2 smallest magnitudes ($mag_1^*$, $mag_2^*$) among the $\kappa$ message magnitudes, and associates them with their local indices ($index_1^*$, $index_2^*$). The local index of a message indicates its location within the cluster, i.e. $index_k^* \in \{1, \ldots, \kappa\}$.

When the Pre-Updater unit has finished the update for the processed cluster, the local magnitude states group for this cluster is selected by 909 and send to the magnitude state CNU-Updater 911 in order to compute the new magnitude state, denoted $MAG^{new}$. The magnitude state CNU-Updater receives the local magnitude states from the Pre-Updater for each CNS in the processed block row. It compares the two smallest magnitudes read from the CNM with the two smallest magnitudes in the local magnitude states, for a total of four magnitudes. The magnitude state CNU-Updater sorts these four magnitudes and outputs only the two smallest ones, together with their associated global indices.

Let us now describe the functioning of the sign state CNU-Updater. For each cluster group, the signs of the input messages are combined with the delayed signs, and accumulated in order to compute the new sign states groups. The delayed signs correspond to the signs of the processed messages from the previous iteration. They are xored with the new message signs of the current iteration in order to detect sign changes.

The sign changes serve as inputs to the Sign Accumulator units 907-908 for each cluster group. The Sign Accumulator units are identical to the ones used in the Initializer, and are described in FIG. 7. They compute the sign states changes for the processed clusters in each group. When a Sign Accumulator unit has finished its processing, the sign state changes for the processed cluster are selected by 910, and xored with the old values of the global sign states group, to obtain the new values for the sign states for the CNS group, denoted $s_m^{new}$.

The CNU-Updater in FIG. 9 is presented for an order-2 GL, and cluster sizes $\kappa$ of any lengths. It can be generalized easily to any higher-order GL, with the main difference that the CNU-Updater processes $\mu$ groups of non-overlapping clusters in parallel.

Figure 10:
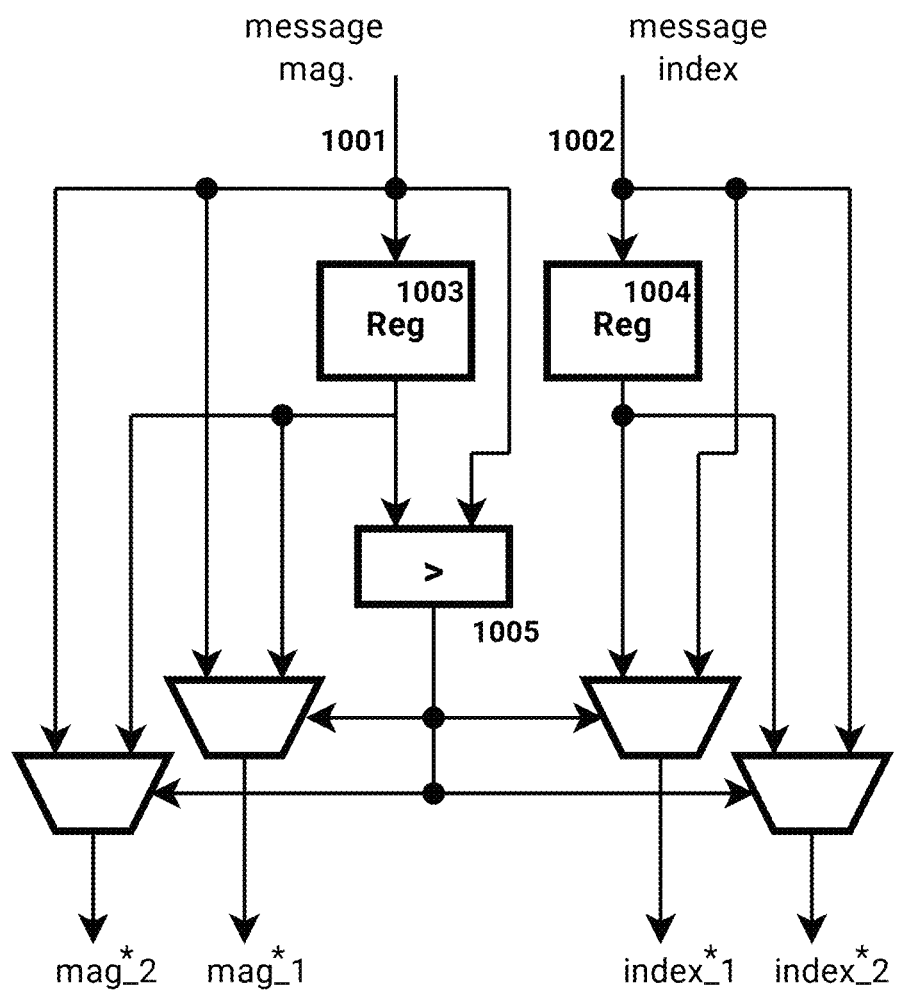
FIG. 10 shows an apparatus for the architecture of a Pre-Updater inside the CNU-Updater, for the case of a size κ=2 cluster.

The CNU-Updater contains $\mu$ Pre-Updater units, each one processing the clusters within one non-overlapping group. We describe in this paragraph the functioning of a single Pre-Updater unit. FIG. 10 shows a CNU Pre-Updater unit in the case $\kappa=2$ clusters. It receives two groups of L message magnitudes 1001, sequentially. First, the message magnitudes group corresponding to the first CPM in the cluster is placed in a register 1003. Then, the message magnitudes for the second CPM are compared with the content of the register. For each CNS in the processed block-row, both magnitudes are output, with the smaller magnitude on the $mag_1^*$ output, and the larger magnitude on the $mag_2^*$ output. The corresponding local indices $index_1^*$ and $index_2^*$ are also output, to form the local magnitude state $MAG^*=\{(mag_1^*, index_1^*); (mag_2^*, index_2^*)\}$.

Figure 11:
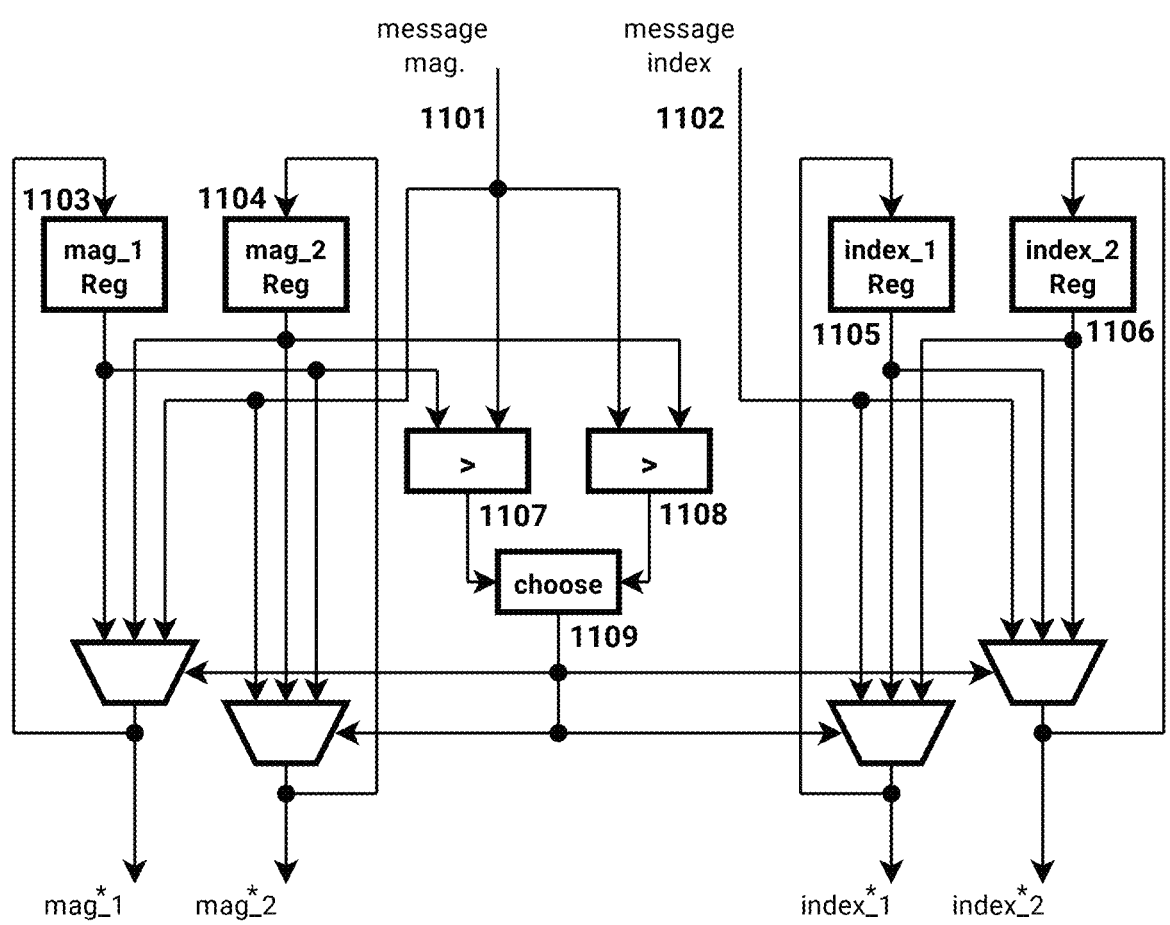
FIG. 11 shows an apparatus for the architecture of a Pre-Updater inside the CNU-Updater, for the case of a size κ>2 cluster.

For the case of clusters of length $\kappa>2$ the Pre-Updater unit determines, for each CNS in the processed block-row, the two minimum magnitudes among the $\kappa$ input messages magnitudes, and associates the two corresponding local indices. FIG. 11 shows the architecture of the Pre-Updater for $\kappa$-clusters. The unit receives a sequence of message magnitudes groups at input 1101, together with the associated local indices at input 1102. In this implementation, the Pre-Updater updates and stores in registers 1103-1104 the two smallest magnitudes $mag_1^*$ and $mag_2^*$, for each CNS, during the processing of the $\kappa$ CPMs of the processed cluster. The incoming magnitudes are compared with the content of the registers, using the comparators 1107-1108, and the Choose unit 1109 decides if the new incoming magnitudes should replace the content of either $mag_1^*$ register, or $mag_2^*$ register, or none of them. The processing of the local indices is performed in parallel, following the same principle. The local indices corresponding to the 2 smallest magnitudes are stored in registers 1105-1106. Once the entire cluster is processed, the Pre-Updater unit outputs the local magnitude state $MAG^*=\{(mag_1^*, index_1^*); (mag_2^*, index_2^*)\}$.

Figure 12:
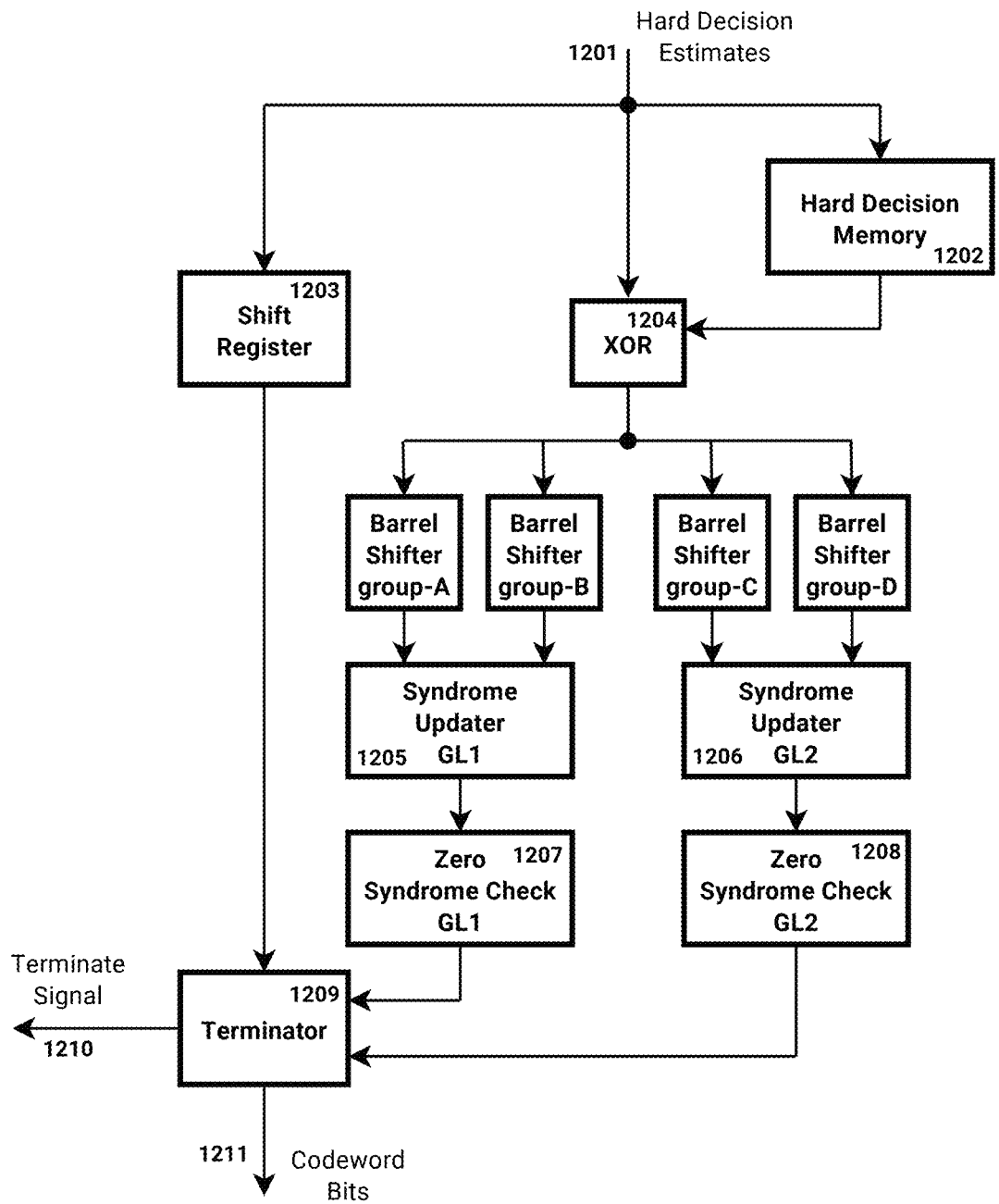
FIG. 12 shows an apparatus for the architecture of the Validator module, for a QC-LDPC code with µ=2 higher order GLs.

Let us now present an apparatus for the implementation of the Validator module 209. The architecture of the Validator module is shown in FIG. 12 by way of example for the case of degree $d_v=4$ block-columns and $\Gamma=2$ higher-order GLs. In this example, each GL has order $\mu=2$ and is composed of two non-overlapping groups of clusters. The first GL is composed of groups A and B, and the second GL is composed of groups C and D.

When processing a block-column, a group of L hard-decision estimates 1201, produced by the VNU processor, arrive at the input of the Validator. The hard decision memory 1202 contains a copy of the most recently computed hard-decision estimates. When the module receives L hard-decision estimates corresponding to the j-th block-column, the memory 1202 contains the hard-decision estimates of the current iteration for all block-columns $k<j$, while it contains the hard-decision estimates of the previous iteration for all block-columns $k \geq j$.

The new hard-decision estimates for block-column j replace the ones from the previous iteration in the hard decision memory 1202. Additionally, a XOR is performed between the newly computed hard-decision estimates and the ones from the previous iteration. Therefore, the XOR unit 1204 outputs the changes in the hard-decision estimates, between the current iteration and the previous iteration. The changes in hard-decision estimates are cyclically shifted by the barrel shifters corresponding to the CPMs in each processed cluster. There is one barrel shifter unit for each group of clusters. Then, they are used as inputs to the Syndrome Updaters 1205 and 1206. Each Syndrome Updater for a higher-order GL contains a Syndrome Memory which stores the syndrome bits of the corresponding GL, and its purpose is to update the values of this memory using the changes in hard-decision estimates. The detailed description of the Syndrome Updater is given subsequently.

The outputs of the Syndrome Updaters are then used in the Zero Syndrome Check units 1207-1208 to detect whether the whole syndrome vector is all zero. In case the syndrome is all-zero, a terminate signal 1210 indicates that the decoder can be stopped, since the hard-decision estimates which are output on 1211 form a valid codeword. The shift register 1203 is used to store the hard-decision estimates immediately after they are being received by the module, while the Validator is determining whether the hard-decision estimates constitute a codeword. The shift register has a width of L bits and a depth equal to the total delay that is necessary for the Terminator unit 1209 to generate the terminate signal. This total delay includes the number of pipeline stages in the Validator, as well as the delay induced by the organization in clusters for the computation of the updated syndrome bits in the Syndrome Updaters 1205 and 1206.

Let us now describe an apparatus for the hardware implementation of the Validator Syndrome Updater units. The Validator is composed of $\Gamma$ of these units, one for each higher-order GL. We show on FIG. 13 the architecture of a Validator Syndrome Updater in the case of an order $\mu=3$ GL, composed of three groups of non-overlapping clusters. The unit contains $\mu$ Sign Accumulators, each one in charge of one of the cluster groups. The Sign Accumulators are indentical to the ones used in the Initializer and the CNU-Updater, and are described in FIG. 7.

Each Sign Accumulator receives sequentially $\kappa$ groups of L barrel shifted hard decisions estimates 1301-1303. The hard decision estimates are used to compute local syndrome bits corresponding to the CNs of the processed clusters. Thanks to the NCC constraint on the clusters, during processing of one block-column, no more than one of the $\mu$ Sign Accumulators will have completed the accumulation of a local syndrome.

Let us assume without loss of generality, and by way of example, that the cluster in group-A has its last CPM in the processed block-column j. Consequently, during processing of block-column j, the Sign Accumulator 1304 of group-A has accumulated the shifted hard decision estimates for all CPMs in the processed cluster, and computed a local syndrome for the full cluster. This output is denoted cluster local syndrome.

The Sign Accumulator 1304 computes the local syndrome for the group-A clusters, while the Sign Accumulators 1305 and 1306 compute the local syndromes for the clusters in the other two groups. The cluster local syndrome of the finished cluster in group-A is chosen by the multiplexer 1310 to update the Syndrome Memory 1312. In order to do so, the syndrome bits group in the Syndrome Memory corresponding to the block-rows of the finished cluster is xored with the cluster local syndrome and written back to the same location in the memory.

However, during the processing of block-column j, the clusters of groups B and C are not finished, and the content of the Syndrome Memory for the corresponding block-rows do not take into account the hard decision estimates of the processed block-columns in group-B and group-C. In order to be able to stop the decoder after processing block-column j, the syndrome bits for the block-rows corresponding to group-B and group-C need to take into account the contribution of all the hard decision estimates from block-columns k≤j. This is achieved by taking snapshots of the cluster local syndromes during processing of block-column j, for cluster groups B and C in the higher-order GL.

The enable signal 1300 triggers a snapshot of the cluster local syndromes output by the Sign Accumulators, and stores them in registers 1307-1309. At block-column j, the snapshot for group-B in register 1308 is the local syndrome of only part of the cluster in group-B, corresponding to the hard decision estimates shifted by the CPMs of the cluster with indices k≤j. The value in this register will be denoted partial cluster local syndrome for the cluster in group-B. Similarly, register 1309 contains the partial cluster local syndrome of only a part of the cluster in group-C. The snapshot for group-A in register 1307 is equal to the cluster local syndrome computed from all CPMs in the cluster, and is denoted full cluster local syndrome.

When selected by the multiplexer 1311, the partial cluster local syndromes for group-B and group-C are combined with the corresponding syndrome bits groups coming for the Syndrome Memory, to form partial cluster syndromes. The partial cluster syndrome for group-B, respectively for group-C, represents the syndrome bits values of the block-rows in group-B, respectively in group-C, when the snapshot was taken, i.e. during processing of block-column j. The multiplexer 1310 selects sequentially the full cluster local syndromes for the three cluster groups, and combines them with the content of the Syndrome Memory for the corresponding block-rows, in order to generate the full cluster syndromes for each group.

As a result, during processing of block-column j, the Syndrome Updater takes a snapshot of the partial cluster local syndrome for all groups, updates the Syndrome Memory for the block-rows of the group-A cluster, and outputs the full cluster syndrome for group-A on 1315. The partial cluster syndrome for group-A, which is equal to the full cluster syndrome is output on 1313. During processing of block-column j+1, the Syndrome Updater updates the Syndrome Memory for the block-rows of the group-B cluster, outputs the partial cluster syndrome for group-B on 1313, and outputs the full cluster syndrome for group-B on 1315. Finally, during processing of block-column j+2, the Syndrome Updater updates the Syndrome Memory for the block-rows of the group-C cluster, outputs the partial cluster syndrome for group-C on 1313, and outputs the full cluster syndrome for group-C on 1315. The register 1314 is added in order to ensure that the outputs 1313 and 1315 will correspond to the same cluster group.

Figure 13:
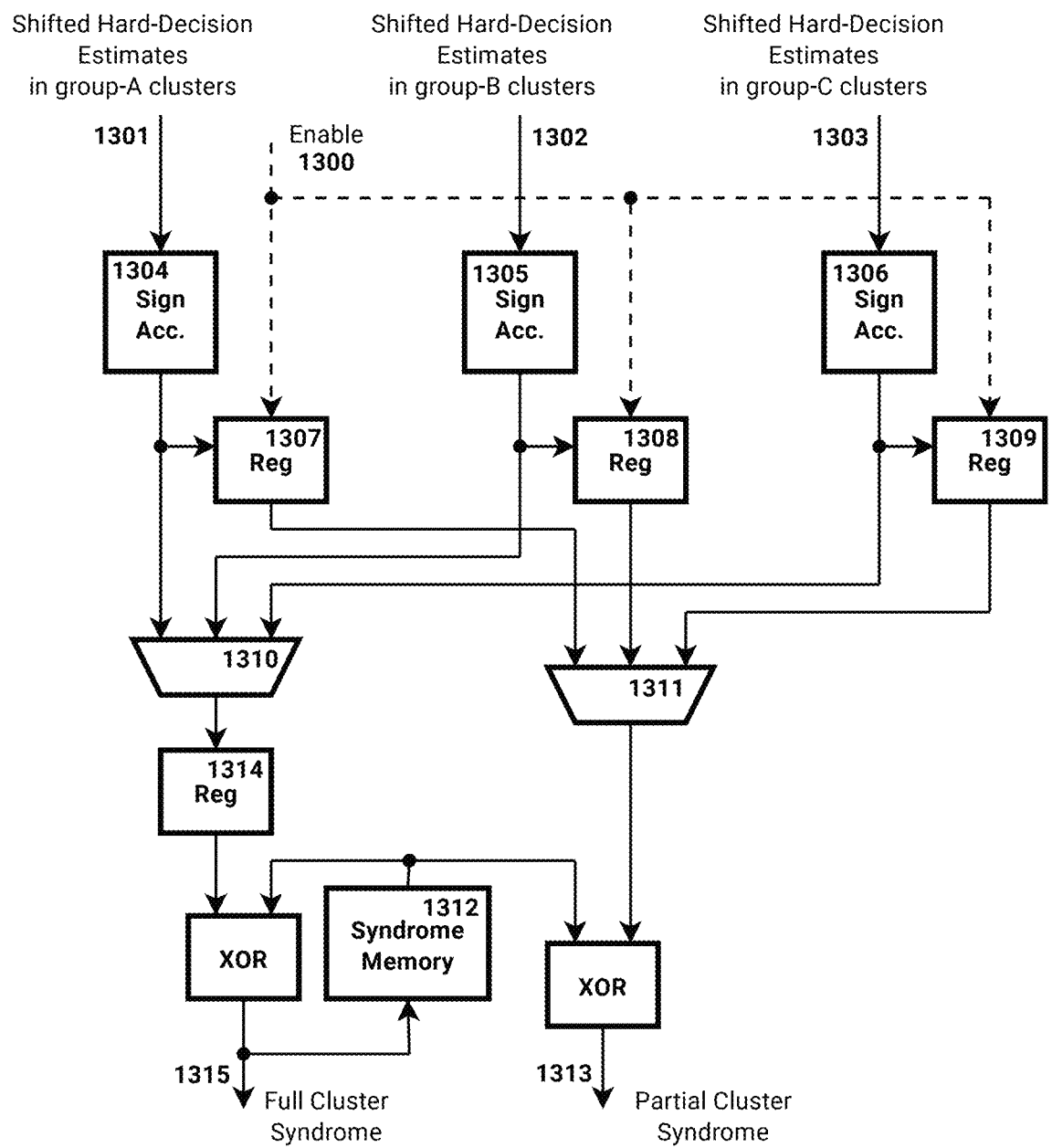
FIG. 13 shows an apparatus for the architecture of a Validator Syndrome Updater unit, for the case of κ-clusters and an order-3 GL.

Each Zero Syndrome Check units 1207 and 1208 in the Validator module take as inputs the full cluster syndromes and the partial cluster syndromes for the cluster groups of the corresponding higher-order GL. In the example of FIG. 13, the higher-order GL is composed of three groups. After processing block-column j, the full cluster syndrome for the group-A cluster and the two partial cluster syndromes for group-B and group-C clusters, contain the syndrome bits of the CN in the block-rows associated to these clusters. The syndrome bits for the other block-rows are contained in the Validator Syndrome Memory. The Zero Syndrome Check unit computes the full syndrome of the whole higher-order GL, using the input cluster syndromes and the content of the Syndrome Memory, and sends a termination signal to the Terminator 1209. A termination signal equal to one indicates that all syndrome bits in the processed higher-order GL are satisfied at the time j of the snapshot. If all signals sent to the Terminator are equal to one, simultaneously, the decoder stops.

What is claimed:

1. A method for vertical layered decoding of quasi-cyclic low-density parity-check codes operating on a parity-check matrix with a structure composed of one or more higher-order generalized layers of order greater or equal than one, wherein each higher-order generalized layer is composed of non-overlapping groups of clusters of one or more circulant permutation matrices (CPMs) with the number of non-overlapping groups at most equal to the order of the higher-order generalized layer, the method comprising:
   receiving, as inputs, channel values belonging to a channel output alphabet;
   using the channel values for initializing, iteratively processing groups of messages between variable nodes and check nodes within block-columns in an arbitrary order, and sequentially from one block-column to another block-column, generating hard decision estimates and validating to check if the hard-decision estimates constitute a codeword based upon which the decoding is terminated;
   computing, during the initializing, respective signs of the variable-to-check messages using the signs of the channel values;
   computing, during the initializing, the initial value of the sign state associated to each check node, by using the signs of the variable-to-check messages;
   further computing, during the initializing, the initial value of the magnitude state associated to each check node, using the channel values;
   storing the check node states in a check node memory, with each check node state associated to a check node comprising, a sign state of the associated check node computed from the signs of the variable-to-check messages, and a magnitude state composed of a set of values comprising one or more smallest magnitudes of the variable-to-check messages of the associated check node along with the same number of respective block-column indices;
   iteratively processing a block-column, wherein the iterative processing includes:
      computing one or more groups of new check-to-variable messages corresponding to each cluster of CPMs, where each cluster of CPMs belongs to a non-overlapping group of clusters in a higher-order generalized layer, using a check node update-generator (CNU-Generator) step, with inputs comprising the check node states and the signs of the one or more groups of variable-to-check messages corresponding to the cluster of CPMs;
      computing new variable-to-check messages with inputs comprising the channel values and the check-to-variable messages, using one or more variable node update functions;
      computing hard decision estimates using the channel values and the check-to-variable messages,
      updating the check node states corresponding to each cluster of CPMs, where each cluster belongs to a non-overlapping group of clusters in a higher-order generalized layer, to new values using a check node update-updater (CNU-Updater) step, with inputs comprising the current values of the check node states, one or more groups of variable-to-check messages corresponding to the cluster of CPMs, and the signs of the one or more groups of variable-to-check messages corresponding to the cluster of CPMs from the previous iteration.

computing, during the validating, the syndrome bits associated to the check nodes corresponding to the entire parity check matrix to check if the hard-decision estimates constitute a codeword; and outputting the codeword, in accordance with the hard decision estimates constituting a codeword.

2. The method of claim 1, wherein the number of CPMs in each cluster of CPMs, where each cluster belongs to a non-overlapping group of clusters in a higher-order generalized layer, is at most equal to two, and the number of non-overlapping groups of clusters in each generalized layer is equal to two.

3. The method of claim 1, wherein the number of CPMs in each cluster of CPMs, where each cluster belongs to a non-overlapping group of clusters in a higher-order generalized layer, is at most equal to three, and the number of non-overlapping groups of clusters in each generalized layer is equal to two.

4. The method of claim 1, wherein the number of CPMs in each cluster of CPMs, where each cluster belongs to a non-overlapping group of clusters in a higher-order generalized layer, is at most equal to three, and the number of non-overlapping groups of clusters in each generalized layer is equal to three.

5. The method of claim 1, wherein the number of CPMs in each cluster of CPMs, where each cluster belongs to a non-overlapping group of clusters in a higher-order generalized layer, is at most equal to four, and the number of non-overlapping groups of clusters in each generalized layer is equal to four.

6. The method of claim 1, wherein the number of CPMs in each cluster of CPMs, where each cluster belongs to a non-overlapping group of clusters in a higher-order generalized layer, is at most equal to six, and the number of non-overlapping groups of clusters in each generalized layer is equal to four.

7. The method of claim 1, wherein the number of CPMs in each cluster of CPMs, where each cluster belongs to a non-overlapping group of clusters in a higher-order generalized layer, is at most equal to eight, and the number of non-overlapping groups of clusters in each generalized layer is equal to four.

8. The method of claim 1, wherein the initializing further comprises:
computing local sign states of the associated check nodes corresponding to each cluster of CPMs, where each cluster of CPMs belongs to a non-overlapping group of clusters in a higher-order generalized layer, by accumulating the signs of the variable-to-check messages corresponding to the cluster of CPMs; and
using the local sign states of the associated check nodes corresponding to each cluster of CPMs to compute the initial value of the sign state for each check node.

9. The method of claim 1, wherein the magnitude state of each check node state is composed of the two smallest magnitudes of the variable-to-check messages of the associated check node along with their two respective block-column indices.

10. The method of claim 1, wherein the CNU-Updater processing step further comprises:
computing local sign states of the associated check nodes corresponding to each cluster of CPMs, where each cluster of CPMs belongs to a non-overlapping group of clusters in the higher-order generalized layer, by using the signs of one or more groups of variable-to-check messages corresponding to the cluster of CPMs, and the signs of the one or more groups of the variable-to-check messages corresponding to the cluster of CPMs from the previous iteration; and
using in combination the local sign states and the current values of the sign states of the associated check nodes corresponding to each cluster of CPMs, to compute the new values of the sign states of the associated check nodes corresponding to the cluster of CPMs.

11. The method of claim 1, wherein the CNU-Updater processing step further comprises:
computing local magnitude states of the associated check nodes corresponding to each cluster of CPMs, where each cluster of CPMs belongs to a non-overlapping group of clusters in the higher-order generalized layer, by using the magnitudes of the one or more groups of the variable-to-check messages corresponding to the cluster of CPMs; and
using in combination the local magnitude states and the current values of the magnitude states of the associated check nodes corresponding to each cluster of CPMs to compute the new values of the magnitude states of the associated check nodes corresponding to the cluster of CPMs.

12. The method of claim 1, wherein the validating further comprises:
computing full cluster local syndrome bits associated to the check nodes corresponding to each cluster of CPMs, where each cluster of CPMs belongs to a non-overlapping group of clusters in a higher-order generalized later, by using inputs comprising the hard-decision estimates of the associated variable nodes corresponding to the cluster of CPMs;
further computing partial cluster local syndrome bits associated to the check nodes corresponding to each cluster of CPMs, where each cluster of CPMs belongs to a non-overlapping group of clusters in a higher-order generalized later, by using inputs comprising the hard-decision estimates of the associated variable nodes corresponding to the cluster of CPMs; and
computing the syndrome bits associated to the check nodes corresponding to the entire parity check matrix using inputs comprising the full cluster local syndrome bits and the partial cluster local syndrome bits for each cluster of CPMs.

13. The method of claim 1, wherein the validating further comprises:
computing the syndrome bits associated to the check nodes corresponding to the entire parity check matrix at the end of the iterative processing of a block-column, to compute the syndrome weight, based upon which the decoding is terminated, and the codeword is outputted.

14. An apparatus for vertical layered decoding of quasi-cyclic low-density parity-check codes operating on a parity-check matrix with a structure composed of one or more higher-order generalized layers of order greater or equal than one, wherein each higher-order generalized layer is composed of non-overlapping groups of clusters of one or more circulant permutation matrices (CPMs), the apparatus comprising:
a check node memory that stores check node states associated to check nodes, wherein each check node state associated to a check node comprises a sign state, and a magnitude state composed of a set of values comprising one or more smallest magnitudes of the variable-to-check messages of the associated check node along with the same number of respective block-column indices;

a sign memory that stores signs of the variable-to-check messages;

an initializer module that computes the initial value of the check node state associated to each check node by using the signs of the variable-to-check messages as inputs;

one or more check node update processors, wherein each check node update processor comprises one or more check node update-generator (CNU-Generator) modules and one or more check node update-updater (CNU-Updater) modules, wherein:

each CNU-Generator module computes one or more groups of new check-to-variable messages corresponding to each cluster of CPMs, where each cluster of CPMs belongs to a non-overlapping group of clusters in a higher-order generalized layer, by using the check node states of the associated check nodes read from the check node memory, and the signs of the one or more groups of variable-to-check messages corresponding to the cluster of CPMs read from the sign memory; and each CNU-Updater module computes the new values of the check node states of the associated check nodes corresponding to each cluster of CPMs, where each cluster of CPMs belongs to a non-overlapping group of clusters in a higher-order generalized layer, by using the current values of the check node states of the associated check nodes read from the check node memory, one or more groups of variable-to-check messages corresponding to the cluster of CPMs, and the signs of the one or more groups of variable-to-check messages corresponding to the cluster of CPMs from the previous iteration, read from the sign memory; and a validator module that computes the syndrome bits associated to the check nodes of the entire parity-check matrix, by using the hard-decision estimates as inputs.

15. The apparatus of claim 14, further comprising an initializer module, which consists of one or more syndrome calculator units, that computes the initial value of the check node state associated to each check node by using the signs of the variable-to-check messages as inputs, wherein each syndrome calculator unit associated to a high-order generalized layer:

computes local sign states of the associated check nodes corresponding to each cluster of CPMs, where each cluster of CPMs belongs to a non-overlapping group of clusters in the higher-order generalized layer, by using one or more syndrome accumulators with the signs of the variable-to-check messages corresponding to the cluster of CPMs as inputs; and uses the local sign states of the associated check nodes corresponding to each cluster of CPMs, to compute the initial sign states of all the check nodes associated to the higher-order generalized layer.

16. The apparatus of claim 14, wherein each CNU-Updater module associated to a higher-order generalized layer computes the new values of the sign states of the associated check nodes corresponding to the higher-order generalized layer, which comprises:

computing local sign states of the associated check nodes corresponding to each cluster of CPMs, where each cluster of CPMs belongs to a non-overlapping group of clusters in the higher-order generalized layer, by using one or more sign accumulators using inputs comprising the signs of one or more groups of variable-to-check messages corresponding to the cluster of CPMs, and the signs of the one or more groups of the variable-to-check messages corresponding to the cluster of CPMs from the previous iteration; and computing the new values of the sign states of the associated check nodes corresponding to the higher-order generalized layer, using in combination, the local sign states of the associated check nodes corresponding to each cluster of CPMs, and the current sign states of the associated check nodes read from the check node memory.

17. The apparatus of claim 14, wherein each CNU-Updater module associated to a higher-order generalized layer computes the new values of the magnitude states of the associated check nodes corresponding to the higher-order generalized layer, which comprises:

computing local magnitude states of the associated check nodes corresponding to each cluster of CPMs, where each cluster of CPMs belongs to a non-overlapping group of clusters in the higher-order generalized layer, by using one or more pre-updater units based on the magnitudes of the one or more groups of variable-to-check messages corresponding to the cluster of CPMs; and computing the new values of the magnitude states of the associated check nodes corresponding to the higher-order generalized layer, using in combination, the local magnitude states of the associated check nodes corresponding to each cluster of CPMs, and the current values of the magnitude states of the associated check nodes read from the check node memory.

18. The apparatus of claim 14, further comprising a validator module, which consists of one or more syndrome updater units, that computes the syndrome bits associated to the check nodes of the entire parity-check matrix, by using the hard-decision estimates as inputs, wherein each syndrome updater unit associated to a higher-order generalized layer:

computes full cluster local syndrome bits of the associated check nodes corresponding to each cluster of CPMs, where each cluster of CPMs belongs to a non-overlapping group of clusters in the higher-order generalized layer, by using inputs comprising the hard-decision estimates of the associated variable nodes corresponding to the cluster of CPMs;

computes partial cluster local syndrome bits of the associated check nodes corresponding to each cluster of CPMs, where each cluster of CPMs belongs to a non-overlapping group of clusters in the higher-order generalized layer, by using inputs comprising the hard-decision estimates of the associated variable nodes corresponding to the cluster of CPMs; and computing the syndrome bits of all the check nodes associated to the higher-order generalized layer, using inputs comprising the full cluster local syndrome bits and the partial cluster local syndrome bits of the associated check nodes corresponding to each cluster of CPMs.

19. The apparatus of claim 14, further comprising a validator module, wherein the validator module computes the syndrome bits associated to the check nodes of the entire parity-check matrix at the end of the iterative processing of a block-column, and checks if the hard-decision estimates constitute a codeword by computing the syndrome weight, based upon which the decoding is terminated, and the codeword is outputted.

* * * * *

UNITED STATES PATENT AND TRADEMARK OFFICE
CERTIFICATE OF CORRECTION

PATENT NO. : 11,258,460 B2
APPLICATION NO. : 17/344689
DATED : February 22, 2022
INVENTOR(S) : Declercq et al.

It is certified that error appears in the above-identified patent and that said Letters Patent is hereby corrected as shown below:

In the Claims

Column 23, Line 3, Claim 1, please delete "iteration." and insert therefor -- iteration, --

Signed and Sealed this
Seventh Day of June, 2022

Katherine Kelly Vidal
*Director of the United States Patent and Trademark Office*